US009865350B2

(12) United States Patent
Sasao

(10) Patent No.: US 9,865,350 B2
(45) Date of Patent: Jan. 9, 2018

(54) CONTENT ADDRESSABLE MEMORY, AN INDEX GENERATOR, AND A REGISTERED INFORMATION UPDATE METHOD

(71) Applicant: Meiji University, Tokyo (JP)

(72) Inventor: Tsutomu Sasao, Kawasaki (JP)

(73) Assignee: Meiji University, Tokyo (JP)

( * ) Notice: Subject to any disclaimer, the term of this patent is extended or adjusted under 35 U.S.C. 154(b) by 0 days.

(21) Appl. No.: 15/505,194

(22) PCT Filed: Aug. 19, 2015

(86) PCT No.: PCT/JP2015/073227
§ 371 (c)(1),
(2) Date: Feb. 20, 2017

(87) PCT Pub. No.: WO2016/027829
PCT Pub. Date: Feb. 25, 2016

(65) Prior Publication Data
US 2017/0271011 A1     Sep. 21, 2017

(30) Foreign Application Priority Data

Aug. 21, 2014  (JP) .................................. 2014-168777

(51) Int. Cl.
*G06F 12/00* (2006.01)
*G06F 13/00* (2006.01)
(Continued)

(52) U.S. Cl.
CPC ............ *G11C 15/04* (2013.01); *G06F 3/0604* (2013.01); *G06F 3/0629* (2013.01); *G06F 3/0673* (2013.01)

(58) Field of Classification Search
CPC ..... G11C 15/04; G06F 3/0604; G06F 3/0629; G06F 3/0673
(Continued)

(56) References Cited

U.S. PATENT DOCUMENTS

| 6,611,512 B1* | 8/2003 | Burns ................... H04B 1/707 370/342 |
| 2003/0033276 A1* | 2/2003 | Cheng ............... G06F 17/30982 |

(Continued)

FOREIGN PATENT DOCUMENTS

| JP | 2004295967 A | 10/2004 |
| WO | 2007119539 A1 | 10/2007 |
| WO | 2007119540 A1 | 10/2007 |

OTHER PUBLICATIONS

S. Kohyama (ed.), Ultra High Speed MOS Device: Ultra high speed device Series 2, the first edition, Baifu-Kan Pub. Co., Feb. 1986, pp. 324-325.

(Continued)

*Primary Examiner* — Sheng-Jen Tsai
(74) *Attorney, Agent, or Firm* — Wood Herron & Evans LLP

(57) ABSTRACT

A content addressable memory according to the present invention includes plural index generators, an output unit, and a controller. The plural index generators generates a signature of an input vector using plural hash functions, and to generate index corresponding to the input vector by searching registered information for a registered vector based on the signature. The output unit combines each output of the plural index generators to produce the index corresponding to the input vector. The controller configured to control an update of the registered information. Each of the plural index generators is configured to generate a first signal indicating whether the index generated based on the signature exists as the registered information to supply the first signal to the controller, to generate the regenerated vector of the index vector by using the index generated based on the signature, to generate a second signal indicating (Continued)

whether the regenerated vector matches the input vector, and to supply the second signal to the controller.

12 Claims, 13 Drawing Sheets

(51) Int. Cl.
*G06F 13/28* (2006.01)
*G11C 15/04* (2006.01)
*G06F 3/06* (2006.01)

(58) Field of Classification Search
USPC .......................................................... 711/108
See application file for complete search history.

(56) References Cited

U.S. PATENT DOCUMENTS

| | | | | |
|---|---|---|---|---|
| 2004/0000928 A1* | 1/2004 | Cheng | ................ | H03K 19/1737 326/41 |
| 2010/0169401 A1* | 7/2010 | Gopal | ....................... | G06F 7/02 708/316 |
| 2010/0228947 A1* | 9/2010 | Sasao | ................ | G06F 17/30949 711/216 |
| 2012/0042114 A1* | 2/2012 | Young | ................... | G06F 3/0611 710/316 |
| 2014/0297996 A1* | 10/2014 | Jayaseelan | ............ | G06F 9/3848 712/239 |
| 2015/0121035 A1* | 4/2015 | Steele, Jr. | ........... | G06F 12/1018 711/216 |
| 2015/0363330 A1* | 12/2015 | Watkins | ................. | G11C 29/42 714/721 |

OTHER PUBLICATIONS

The Institute of Electronics, Information and Communication Engineers, First edition, Ohmsha LTD., Nov. 1984, pp. 523-525.

Kostas Pagiamtzis et al., "A Low-Power Content-Addressable Memory (CAM) Using Pipelined Hierarchical Search Scheme," IEEEJournal of Solid-State Circuits, vol. 39, No. 9, Sep. 2004, pp. 1512-1519.

T. Sasao et al., "A cascade realization of multiple-output function for reconfigurable hardware," International Workshop on Logic and Synthesis (IWLS01), Lake Tahoe, CA, Jun. 12-15, 2001, pp. 225-230.

T. Sasao, "Memory-Based Logic Synthesis," Springer 2011.

T. Sasao, "A Programmable Logic Circuit for Pattern Matching and its Design Methods," IEICE, vol. 96, No. 2, 2013.

Hiroki Nakahara et al., "A Virus Scanning Engine Using a Parallel Sieve Method and the MPU," IEICE Technical Report, vol. 109, No. 320, Dec. 3, 2009 (Dec. 3, 2009), pp. 25-30.

PCT Office, International Search Report issued in PCT Application No. PCT/JP2015/073227 dated Oct. 6, 2015, 2 pages.

Hiroki Nakahara et al., "An Architecture for IPv6 Lookup Using Parallel Index Generation Units," SIG Technical Report Feb. 2013 System LSI Design Methodology (SLDM), Japan, Information Processing Society of Japan, Feb. 15, 2013, No. 159(5).

Japanese Patent Office, Notice of Allowance issued in Japanese Patent Application No. 2016-544229 dated Sep. 12, 2017, 6 pages.

\* cited by examiner

| x1 | x2 | x3 | x4 | x5 | x6 | IDX |
|----|----|----|----|----|----|-----|
| 0  | 1  | 1  | 0  | 0  | 0  | 1   |
| 0  | 1  | 0  | 1  | 1  | 1  | 2   |
| 1  | 1  | 1  | 1  | 0  | 1  | 3   |
| 0  | 0  | 0  | 1  | 1  | 1  | 4   |
| 0  | 0  | 1  | 1  | 1  | 1  | 5   |
| 0  | 1  | 1  | 1  | 0  | 0  | 6   |
| 0  | 0  | 1  | 0  | 0  | 0  | 7   |
| 1  | 1  | 1  | 1  | 1  | 1  | 8   |
| 1  | 1  | 1  | 0  | 1  | 1  | 9   |
| 1  | 0  | 1  | 0  | 0  | 0  | 10  |
| 1  | 0  | 0  | 1  | 1  | 1  | 11  |
| 0  | 0  | 1  | 0  | 1  | 1  | 12  |
| 1  | 0  | 1  | 0  | 1  | 0  | 13  |
| 0  | 0  | 1  | 1  | 0  | 0  | 14  |
| 1  | 1  | 0  | 0  | 1  | 0  | 15  |

CONTENT ADDRESSABLE MEMORY, AN INDEX GENERATOR, AND A REGISTERED INFORMATION UPDATE METHOD

TECHNICAL FIELD

The present invention relates to a content addressable memory, an index generator, and a registered information update method, and more particularly to a technique for accelerating an update of registered information registered in the index generator provided in the content addressable memory.

The present application claims priority based on Japanese Patent Application No. 2014-168777 filed in Japan on Aug. 21, 2014, the content of which is incorporated herein.

BACKGROUND ART

A regular memory generates a registered data stored at that address for a given address or index. On the other hand, a CAM (Content Addressable Memory) generates an address of the CAM that stores it for a given search data or an input data (see Non-patent Documents 1 and 2).

The CAM is used in a wide range of fields including a pattern matching, an internet router, a cache of a processor, a TLB (Translation Lookaside Buffer), a data compression, an accelerator of a database, a neural network, and a memory patch.

Normally, the CAM is classified into two types according to functions, such as a Binary CAM (hereinafter, referred to as a "BCAM") and a Ternary CAM (hereinafter, referred to as a "TCAM"). The BCAM stores 0 and 1 in each cell. The TCAM stores 0, 1, and * in each cell. Here, the * represents a "do not care" and matches both the 0 and the 1.

Although, the function of the CAM may be realized by software, the function realized by the software is significantly slow. Therefore, the CAM is often realized by using a dedicated hardware.

PATENT ART REFERENCE

Patent Reference

Japanese Unexamined Patent Application, First Publication No. 2004-295967

Non-Patent Reference

NPR 1: Supervised by Takuo Sugano, edited by Susumu Kohyama, "Ultra High Speed Device Series 2 Ultra High Speed MOS Device", First edition, Baifukan, February 1986, pp. 324-325.
NPR 2: Edited by The Institute of Electronics, Information and Communication Engineers, First Edition, Ohmsha, Ltd., November 1994, pp. 523-525.
NPR 3: Kostas Pagiamtzis and Ali Sheikholeslami, "A Low-Power Content-Addressable Memory (CAM) Using Pipelined Hierarchical Search Scheme", IEEE Journal of Solid-State Circuits, Vol. 39, No. 9, September 2004, pp. 1512-1519.
NPR 4: T. Sasao, M. Matsuura, and Y. Iguchi, "A cascade realization of multi-output function for reconfigurable hardware", International Workshop on Logic and Synthesis (IWLS01), Lake Tahoe, Calif., Jun. 12-15, 2001, pp. 225-230.
NPR 5: T. Sasao, "Memory-Based Logic Synthesis", Springer 2011.
NPR 6: Tsutomu Sasao, "A Programmable Logic Circuit for Pattern Matching and Its Design Methods", Journal of the Institute of Electronics, Information and Communication Engineers, Vol. 96, No. 2, pp. 100-104, February 2013.

SUMMARY OF THE INVENTION

Problem to be Solved by the Invention

Although, the above-mentioned conventional CAM is high-speed compared with the RAM because it can be searched in-parallel, the configuration of the device is complicated. Therefore, the price per-bit (bit cost) of the CAM is about 10 to 30 times more expensive than the RAM. Further, a power consumption per-bit of the CAM is much larger than that of the RAM (see Non-Patent Reference 3). This is caused by simultaneously accessing all the CAM cells. Therefore, the power consumption per-bit of the CAM is about 50 times as much as the normal RAM. Thus, with the conventional CAM, it is difficult to increase a storage capacity from the viewpoint of the bit cost and the power consumption.

The present invention has been made in view of the above circumstances, and it is an object of the present invention to provide the content addressable memory, the index generator, and the registered information update method at a high speed capable of increasing the storage capacity.

Means to Solve the Problem

One aspect of a content addressable memory according to an embodiment of the present invention, the content addressable memory includes plural index generators for generating a signature of an input vector using plural hash functions, and for generating an index corresponding to the input vector by searching registered information for a registered vector based on the signature; an output unit for combining each output of the plural index generators to produce the index corresponding to the input vector; a controller for controlling an update of the registered information, wherein each of the plural index generators is for generating a first signal indicating whether the index generated based on the signature exists as the registered information, for supplying the first signal to the controller, for generating the regenerated vector of the index vector by using the index generated based on the signature, for generating a second signal indicating whether the regenerated vector matches the input vector, and for supplying the second signal to the controller.

One aspect of an index generator according to an embodiment of the present invention, an index generator includes: a hash circuit that computes and produces a signature of an input vector from the input vector; a provisional index generation circuit that has main storage in which an index corresponding to a registered vector is stored as registered information for a registered vector, reads a provisional index corresponding to the signature from the main storage and produces the provisional index; a signal generation circuit that generates and produces a first signal indicating whether the provisional index corresponding to the signature exists as the registered information based on the provisional index produced by the provisional index generation circuit; a regenerated vector generation circuit that has secondary storage in which the registered vector is stored as the registered information for the registered vector, and reads a vector corresponding to the provisional index from the secondary storage and produces the vector as the regenerated vector; a comparator that compares the regenerated vector with the input vector and produces a second signal indicating whether the regenerated vector matches the input vector; and an output circuit that produces the provisional index as a specific index corresponding to the input vector when the second signal indicates that the regenerated vector matches the input vector.

One aspect of an information update method according to an embodiment of the invention, the information update method is for updating the registered information of the content addressable memory, wherein the content addressable memory provides a search mode and an update mode as an operation mode, and the controller provided in the content addressable memory controls for updating the registered information in the update mode.

According to one embodiment of the present invention, the present invention can be performed the update of the registered information at a high speed while enabling the large-scale storage capacity.

EMBODIMENTS

Several terms used in the present specification are defined as follows.

[Definition 1] (Registered Vector)

A set of k mutually different (k is a natural number) n bits (n is a natural number) vectors may be considered. The set of vectors is referred to as a set of registered vectors, and each vector belonging to the set of registered vectors is called a registered vector.

[Definition 2] (Index Generation Functions, Index Generator, Input Vector)

A function of which an input matching each element of the set of registered vectors is injected into a specific index or a unique index from 1 to k, and other inputs are mapped into 0 is referred to as an index generation function. That is, if we have $f(a_i)=i$ $(i=1, 2, \ldots, k)$ for a k different registered vector $a_i \in B^n$ $(i=1, 2, \ldots, k)$, we have $f(a_1)=0$ for other $(2^n-k)$ input vectors, in the function $f(X): B^n \to \{0, 1, \ldots, k\}$ ($B=\{0, 1\}$, k∈natural numbers), f(x) is referred to as the index generation function with weight k. The index generation function may generate the specific indices from 1 to k for k different binary vectors. In the present specification, it is assumed that the value of k is sufficiently smaller than the total number of combinations $2^n$ ($k<<2^n$) of the input vectors.

The circuit that computes the index generation function is referred to as an index generator. The vector input to the index generator is referred to as an input vector. The index generation function of which the input vector is an n-dimensional vector is referred to as an index generation function of n inputs. A circuit that computes the index generation function of n inputs is referred to as an index generator of n inputs.

[Definition 3] (Hash Function)

A hash function is a mapping from a set S to an integer set $\{0, 1, \ldots, \text{and } m-1\}$. Here, m is a natural number not exceeding the number of elements of the set S.

Hereinafter, one embodiment of the present invention will be described with reference to the drawings.

The First Embodiment

1. Description of the Configuration

Figure 1:
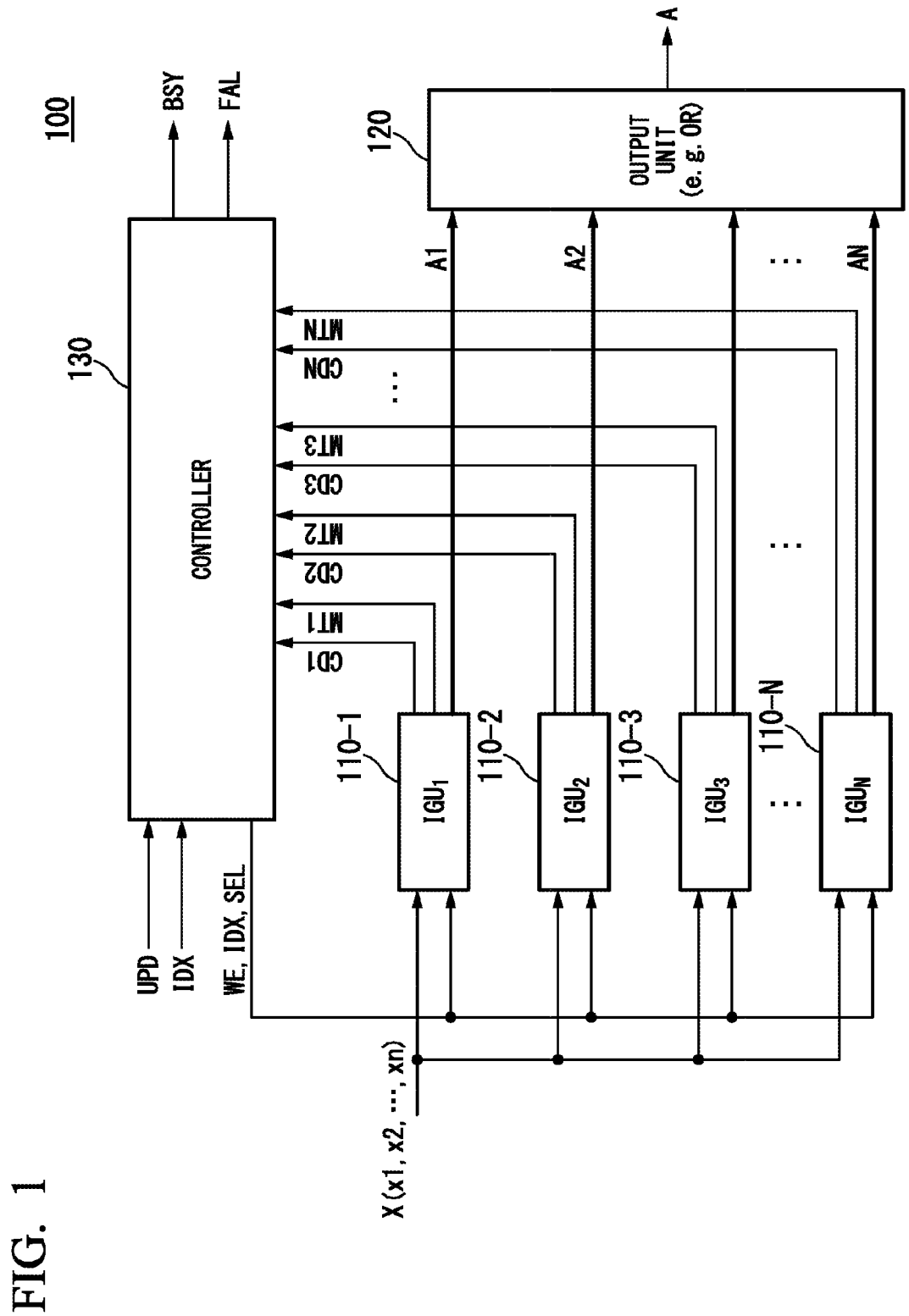
FIG. 1 is a block diagram showing an example of a configuration of a content addressable memory according to the first embodiment of the present invention.

FIG. 1 is a block diagram showing a configuration example of a content addressable memory 100 according to the first embodiment of the present invention. The content addressable memory 100 may be for generating and producing a specific index A corresponding to an input vector X (x1, x2, . . . , xn) of n bits to be a searching target (the n is a natural number). The content addressable memory 100 may include n index generators 110-1, 110-2, 110-3, . . . , and 110-N, an output unit 120, and a controller 130. In the following, an arbitrary one of the N index generators 110-1, 110-2, 110-3, . . . , and 110-N is referred to as a "index generator 110-$i$" (i is the natural number which is from 1 to N). Further, each of the index generators 110-1, 110-2, 110-3, . . . , and 110-N may be handled as a unit such as the index generator.

The N index generators 110-1, 110-2, 110-3, . . . , and 110-N may generate signatures of the input vector X, may generate and produce the specific indices A1, A2, . . . , and AN respectively from the signature. That is, N index generators 110-1, 110-2, 110-3, . . . , and 110-N may respectively generate the signatures of the input vector X using the hash functions, and may search the registered information for the registered vector registered in each index generator based on the signature. The N index generators 110-1, 110-2, 110-3, . . . , and 110-N may search the registered information for the registered vectors registered in each index generator. As a result, the specific indices A1, A2, A3, . . . , and AN corresponding to the input vector X may be generated. In the present embodiment, as will be described later, a linear function which may be realized by a circuit consisting of exclusive-OR gates only may be used as the hash function. The N hash functions respectively used in the N index generators 110-1, 110-2, 110-3, . . . , and 110-N, may be the same functions or may be mutually different functions as long as they comply with the above [definition 3]. That is, each of the N index generators 110-1, 110-2, 110-3, . . . , and 110-N may use the same hash function as the hash function used in other index generators, or may use a different hash function from the hash functions used in other index generators.

Each of the index generators 110-1, 110-2, 110-3, . . . , and 110-N may generate a first signal (Hereinafter, referred to as "collision signal") CD1, CD2, CD3, . . . , and CDN indicating whether the index generated based on the signature may exist as the registered information. Each of the index generators 110-1, 110-2, 110-3, . . . , and 110-N may generate the regenerated vector of the input vector X by using the index generated based on the signature. Each of the index generators 110-1, 110-2, 110-3, . . . , and 110-N may generate a second signal (hereinafter, referred to as "match signal") MT 1, MT2, . . . , and MTN indicating whether the regenerated vector matches the input vector X. Here, the "regenerated vector" is a vector that regenerates the original input vector X based on the index acquired from the signature of the input vector X. The collision signals CD (CD1, CD2, CD3, . . . , and CDN) and the match signals MT (MT1, MT2, . . . , and MTN) are supplied to the controller 130.

The output unit 120 combines each of the outputs (indices A1, A2, A3, . . . , and AN) of N index generators 110-1, 110-2, 110-3, . . . , and 110-N, and produces the specific index A corresponding to the input vector X. The controller 130 is for controlling the update of the registered information registered in each of the N index generators 110-1, 110-2, 110-3, . . . , and 110-N. A selection signal SEL for designating any one of a write enable signal WE for controlling a writing operation of the registered vector which is the registered information, an index IDX of the registered vector, and the index generators 110-1, 110-2, 110-3, . . . , and 110-N to which registered information may be written, may be supplied from the controller 130 to the index generators 110-1, 110-2, 110-3, . . . , and 110-N. It is to be noted that the controller 130 may change the operation mode to the update mode if the command signal UPD is supplied. The controller 130 may add new registered information if the command signal UPD and the index IDX are supplied. The controller 130 may delete the existing registered information if only the command signal UPD is supplied. The controller 130 produces a signal BSY (busy) indicating that it is in the operation during operation such as the update mode, for example. The controller 130 produces a FAL signal (fail) indicating that the registration failed, for example, if the operation of adding the new registered information fails.

Here, for simplicity of explanation, it is assumed that N=3, and the content addressable memory 100 shown in FIG. 1 may include three index generators 110-1, 110-2, and 110-3. Therefore, i indicates the arbitrary natural number of 1, 2, and 3. The index generator 110-$i$ indicates one of the index generators 110-1, 110-2, and 110-3. However, the present invention is not limited to the present example, and the number N of the index generators may be arbitrarily set. It is assumed that n=6, and the input vectors X (x1, x2, x3, x4, x5, x6) of 6 bits are input to three index generators 110-1, 110-2, and 110-3.

Figure 2:
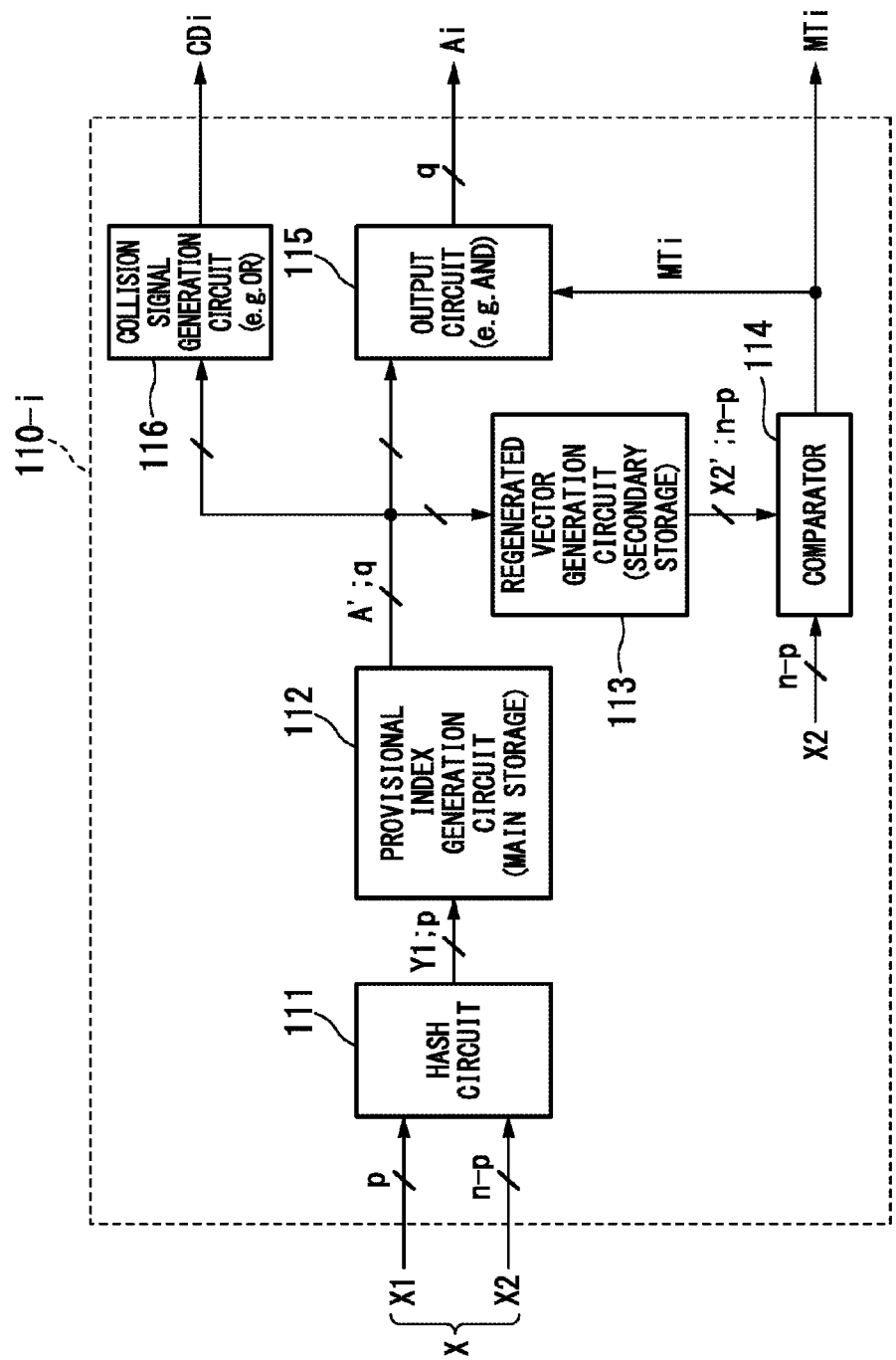
FIG. 2 is a block diagram showing an example of a configuration of an index generator provided in the content addressable memory according to the first embodiment of the present invention.

Next, details of each of the index generator 110-$i$, the output unit 120, and the controller 130 will be described. FIG. 2 is a block diagram showing a configuration example of the index generator 110-$i$ provided in the content addressable memory 100 according to the first embodiment of the present invention. The index generator 110-$i$ may include a hash circuit 111, a provisional index generation circuit 112, the regenerated vector generation circuit 113, a comparator 114, an output circuit 115, and a collision signal generation circuit 116. The hash circuit 111 may be for generating a vector Y1 of p-bit (p is a natural number smaller than n) indicating the signature of the input vector X from the n-bit input vector X by using the hash function. Here, it is assumed that p=3. The hash function sometimes gives the same value for different inputs, which is referred to as a hash collision. In the content addressable memory 100 according to the present embodiment, if the hash collision occurs with a certain hash function, the hash collision may be avoided by using another index generator. The details will be described later.

The temporary index generation circuit 112 may generate a provisional index A' of q-bit corresponding to the p-bit vector Y1 indicating the signature of the input vector X. Here, $q = \lceil \log_2 (k_i+1) \rceil$, $k_i$ may indicate the number of the registered vector realized by the index generator 110-$i$, and $\lceil \log_2 (k_i+1) \rceil$ may indicate the ceiling function. The provisional index generation circuit 112 may include main storage in which an index of the registered vector may be stored as the registered information and may read and produce the provisional index A' corresponding to the signature of the input vector X from the main storage. The main storage may include a general-purpose semiconductor memory such as a DRAM (Dynamic Random Access Memory) or a SRAM (Static Random Access Memory) in which a bit sequence indicating the signature is inserted as an address signal. However, the main storage need not be a general-purpose memory or may be a dedicated memory as long as it adopts a method of selecting a part of memory cells of the memory cell array by one access, same as the general-purpose memory such as the DRAM.

The regenerated vector generation circuit 113 may be for regenerating the input vector X corresponding to the provisional index A', and may include secondary storage in which the registered vector may be stored as registered information. The regenerated vector generation circuit 113 may read the registered vector corresponding to the provisional index A' from the secondary storage and may produce it as a (n-p)-bit regenerated vector X2'. The (n-p)-bit regenerated vector X2' is an element that regenerated X2 of the input vector X (X1, X2). Here, X1 means the bits x1, x2, x3 of the input vector X, and X2 means the bits x4, x5, x6 of the input vector X. The secondary storage may include the general-purpose semiconductor memory such as the DRAM or the SRAM in which the bit sequence indicating the provisional index A' is inserted as the address signal. The secondary storage may be a dedicated memory same as the main storage. When a nonlinear function is used as the hash function, the regenerated vector generation circuit 113 may produce the n-bit regenerated vector X' corresponding to all bits of the input vector X.

The comparator 114 may be for verifying whether the regenerated vector X2' matches the X2 (x4, x5, x6) of the input vector X. Verifying whether the regenerated vector X2' matches the X2 of the input vector X means to verify whether the provisional index A' is the specific index corresponding to the input vector X. The comparator 114 may compare the regenerated vector X2' with the X2 of the input vector X and may produce the match signal MTi indicating whether the regenerated vector X' matches the X2 of the input vector X based on the result of the comparison.

The output circuit 115 is for producing a specific index Ai or a predetermined invalid value corresponding to the input vector X based on the match signal MTi. That is, the output circuit 115 may produce the provisional index A' as the specific index Ai if the match signal MTi indicates the match between the regenerated vector X2' and the X2 of the input vector X. The output circuit 115 may produce the predetermined invalid value if the match signal MTi indicates the mismatch between the regenerated vector X2' with the input vector X2. In the present embodiment, if the values of all bits of the index Ai are "0", the index Ai may indicate the predetermined invalid value. However, it is not limited to this example, and the definition of the invalid value is arbitrary. For example, the index Ai of which the value of all bits is "1" may be set as the invalid value.

The collision signal generation circuit 116 may generate and produce a collision signal CDi based on the provisional index A' produced by the temporary index generation circuit 112 in the update mode. In the first embodiment, when the collision signal generation circuit 116 adds a new registered vector as the registered information in the update mode, the collision signal generation circuit 116 may produce the collision signal CDi based on the provisional index A' produced by the provisional index generation circuit 112. Here, the collision signal CDi is a signal indicating the presence or absence of the hash collision in the update mode. If the provisional index A' produced by the provisional index generation circuit 112 for the input vector X to be updated is not the invalid value, that is, if the hash collision occurs, the collision signal CDi may be "1". The value of the collision signal CDi when the hash collision occurs may be arbitrarily set.

Figure 3A:
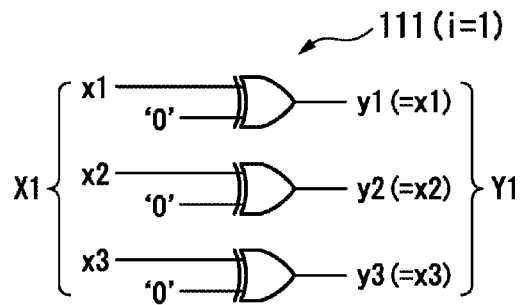
FIG. 3A is a circuit diagram showing an example of a configuration of a hash circuit of a first index generator provided in the content addressable memory according to the first embodiment of the present invention.
Figure 3B:
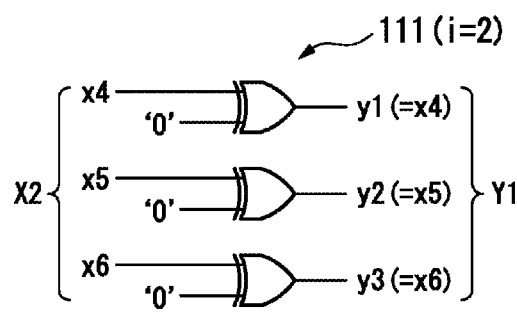
FIG. 3B is a circuit diagram showing an example of a configuration of a hash circuit of a second index generator provided in the content addressable memory according to the first embodiment of the present invention.
Figure 3C:
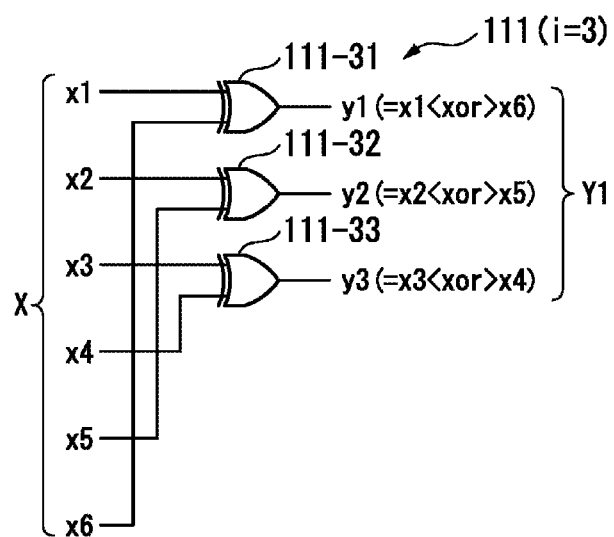
FIG. 3C is a circuit diagram showing an example of a configuration of a hash circuit of a third index generator provided in the content addressable memory according to the first embodiment of the present invention.

FIG. 3A to FIG. 3C are circuit diagrams showing an example of the configuration of the hash circuit 111 provided in the index generator 110-i provided in the content addressable memory 100 according to the first embodiment of the present invention. FIG. 3A shows an example of the configuration of the hash circuit 111 (i=1) provided in the index generator 110-1. FIG. 3 B shows an example of the configuration of the hash circuit 111 (i=2) provided in the index generator 110-2. FIG. 3C shows an example of the configuration of the hash circuit 111 (i=3) provided in the index generator 110-3. In FIG. 3A to FIG. 3C, input vector X (x1, x2, x3, x4, x5, x6) of the 6-bit (n=6) may be assumed as the input vector X input to the index generator 110-i.

The hash circuit 111 (i=1) shown in FIG. 3A may realize the hash function for computing the signature of the input vector X in the index generator 110-1. In the example of FIG. 3A, the hash circuit 111 may realize the hash function for converting the 3 bits of the X1 (x1, x2, x3) among the 6 bits (x1, x2, x3, x4, x5, x6) of the input vector X into the 3 bits (p=3) of the vector Y1 (y1, y2, y3) indicating the signature of the input vector X. More specifically, the hash circuit 111 shown in FIG. 3A is configured to three exclusive-OR gate circuits. Each bit of the X1 (x1, x2, x3) may be respectively supplied to the first input of the three exclusive-OR gate circuits, and the value "0" may be commonly supplied to the second input. As a result, the hash circuit 111 in FIG. 3A may produce the X1 (x1, x2, x3) of the input vector X as the 3-bit vector Y1 (y1, y2, y3).

The hash circuit 111 (i=2) shown in FIG. 3B may realize the hash function for computing the signature of the input vector X in the index generator 110-2. In the example of FIG. 3B, the hash circuit 111 may realize the hash function for converting the 3 bits of the X2 (x4, x5, x6) among the 6 bits (x1, x2, x3, x4, x5, x6) of the input vector X into 3 bits (p=3) of the vector Y1 (y1, y2, y3). More specifically, the hash circuit 111 shown in FIG. 3B is configured to three exclusive-OR gate circuits. The respective bits of the X2 (x4, x5, x6) may be respectively supplied to the first input of the three exclusive-OR gate circuits, and the value "0" is commonly supplied to the second input. As a result, the hash circuit 111 (i=2) in FIG. 3B may produce X2 (x4, x5, x6) of the input vector X to 3-bit of the vector Y1 (y1, y2, y3).

The hash circuit 111 (i=3) shown in FIG. 3C may realize the hash function for computing the signature of the input vector X in the index generator 110-3. In the example of FIG. 3C, the hash circuit 111 may compute the exclusive-OR of the bits x1 and x6 among the 6 bits (x1, x2, x3, x4, x5, x6) of the input vector X. The hash circuit 111 may realize the hash function for producing the result of the computation as the vector Y1 (y1, y2, y3) of the 3 bits (p=3) indicating the signature of the input vector X.

Specifically, the hash circuit 111 (i=3) shown in FIG. 3C is configured to three exclusive-OR gate circuits 111-31, 111-32, and 111-33. The bits x1 and x6 of the input vector X may be supplied to input terminal of the exclusive-OR gate circuit 111-31. The exclusive-OR gate circuit 111-31 may compute the exclusive-OR of the bits x1 and x6, and set the result of the computation to the value of the bit y1 of the vector Y1. The bits x2 and x5 of the input vector X may be supplied to the input terminal of the exclusive-OR gate circuit 111-32. The exclusive-OR of the bits x2 and x5 may be computed by the exclusive-OR gate circuit 111-32, and the result of the computation may be set to the value of the bit y2 of the vector Y1.

Furthermore, the bits x3 and x4 of the input vector X may be supplied to the input terminals of the exclusive-OR gate circuit 111-33. The exclusive-OR of the bit x3 and the bit x4 is computed by the exclusive-OR gate circuit 111-33, and the result of the computation is the value of the bit y3 of the vector Y1. Thus, the three hash circuits 111 (i=1), 111 (i=2) and 111 (i=3) may realize mutually different hash functions.

The hash function realized by each hash circuit 111 of the index generators 110-1, 110-2, and 110-3 may be set according to the contents of the registered vector so that the signature capable of clearly distinguishing the registered vectors with a bit number p which is smaller than a bit number n of the input vector X. The details will be described later.

Next, the configuration of the provisional index generation circuit 112 provided in the index generator 110-i shown in FIG. 2 will be described. As described above, the provisional index generation circuit 112 may be configured to the general-purpose semiconductor memory such as the DRAM, and the general-purpose semiconductor memory may form the main storage of the provisional index generation circuit 112. A memory of an arbitrary type such as the ferroelectric memory or the magnetoresistive RAM may be used as a memory for forming the main storage of the provisional index generation circuit 112 as long as both writing and reading data are possible. Information for the index of the registered vector may be stored as the registered information in the memory forming the main storage of the provisional index generation circuit 112. Each bit of the p-bit vector Y1 produced by the hash circuit 111 may be supplied as the address signal to the address input terminal of the general-purpose memory forming the main storage of the provisional index generation circuit 112.

Here, data indicating the index corresponding to the signature may be stored in a memory cell of the general-purpose memory forming the main storage designated by the combination of the values of the respective bits of the vector Y1, as the registered information for the index of the registered vector. Therefore, the q-bit index corresponding to the signature of the input vector X may be read from the main memory as the provisional index A' by accessing a general-purpose memory forming the main storage based on the vector Y1.

Next, the configuration of the regenerated vector generation circuit 113 provided in the index generator 110-i shown in FIG. 2 will be described. The regenerated vector generation circuit 113 is composed of the general-purpose semiconductor memory such as the DRAM which is same as the provisional index generation circuit 112 described above. The general-purpose semiconductor memory may form the secondary storage of the regenerated vector generation circuit 113. The arbitrary system memory such as the ferroelectric memory or the magnetoresistive RAM may be used as the memory for forming the secondary storage of the regenerated vector generation circuit 113 as long as both data writing and reading are possible. The values of the bits of the registered vector may be stored as the registered information in the memory forming the secondary storage of the regenerated vector generation circuit 113. Each bit of the provisional index A' of the q bits produced by the provisional index generation circuit 112 may be supplied as the address signal to the address input terminal of the general purpose memory forming the secondary storage of the regenerated vector generation circuit 113.

In the present embodiment, since a linear function is used as the hash function in the hash circuit 111, it is sufficient to compare a part of the bits to confirm the correspondence between the input vector and the regenerated vector in the comparator 114 described later. Therefore, the values of the (n-p) bits which are a part of bits of the registered vector corresponding to the provisional index A' may be stored as the registered information for the registered vector in the index of the general-purpose memory forming the secondary storage specified by the combination of the values of the respective bits of the provisional index A'. However, when the nonlinear function is used as the hash function, the value of all bits (i.e., n bits) of the registered vector may be stored as the registered information in the memory forming the secondary storage.

The provisional index A' corresponds to the input vector X. Therefore, the part of the bits of the registered vector corresponding to X2 of the input vector X may be read from the above described secondary storage as the regenerated vector X2' by accessing the general-purpose memory forming the secondary storage of the regenerated vector generation circuit 113 based on the provisional index A'.

The main storage of the provisional index generation circuit 112 and the secondary storage of the regenerated vector generation circuit 113 may be integrated into one semiconductor memory such as the DRAM. As a result, the number of the components may be reduced and the memory access time may be reduced.

Figure 4A:
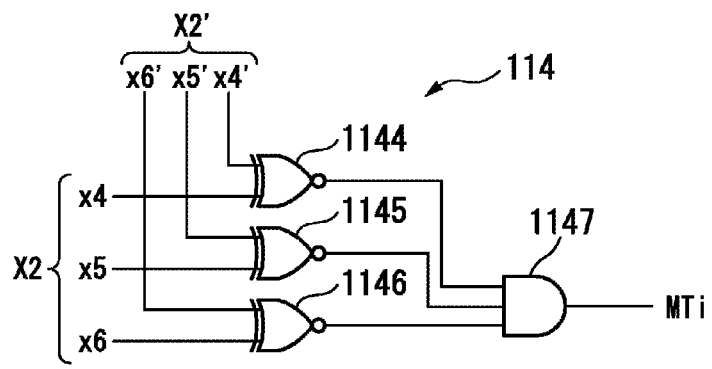
FIG. 4A is a diagram showing an example of a configuration of a comparator of the index generator provided in the content addressable memory according to the first embodiment of the present invention.

Next, the configuration of the comparator 114 provided in the index generator 110-i shown in FIG. 2 will be described. FIG. 4A is a diagram showing a configuration example of the comparator 114 of the index generator 110-i provided in the content addressable memory 100 according to the first embodiment of the present invention. The comparator 114 is composed of exclusive-NOR gate circuits 1144, 1145, and 1146, which are coincidence gates. The input terminals of the exclusive-NOR gate circuit 1144 may be supplied with the bit x4 of the X2 of the input vector X and the bit x4' of the regenerated vector X2'. The bit x5 of the X2 of the input vector X and the bit x5' of the regenerated vector X2' may be supplied to the input terminals of the exclusive-NOR gate circuit 1145. Further, the bit x6 of the X2 of the input vector X and the bit x6' of the regenerated vector X2' may be supplied to the input terminals of the exclusive-NOR gate circuit 1146. Each output unit of the exclusive-NOR gate circuits 1144, 1145, and 1146 is connected to the input terminal of an AND-gate circuit 1147, and the output signal of the AND-gate circuit 1147 may be used as the match signal MTi.

According to the configuration of the above-mentioned comparator 114, only when the respective values of the bits x4, x5, and x6 of the X2 of the input vector X, and the values of the bits x4', x5', and x6' of the regenerated vector X2' are perfectly matched, a high-level logic signal indicating the value "1" may be produced as the signal MTi.

Figure 4B:
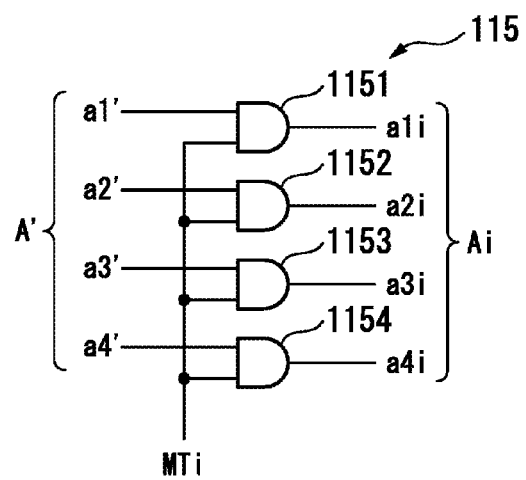
FIG. 4B is a diagram showing an example of a configuration of an output circuitry of the index generator provided in the content addressable memory according to the first embodiment of the present invention.

Next, the configuration of the output circuit 115 provided in the index generator 110-i shown in FIG. 2 will be described. FIG. 4B is the diagram showing a configuration example of the output circuit 115 of the index generator 110-i provided in the content addressable memory 100 according to the first embodiment of the present invention. In this example, it is assumed that the provisional index A' is indicated by the 4 bits (a1', a2', a3', and a4') considering k=15. However, the present invention is not limited to the example, and the number of the bits of the provisional index A' may be set to an arbitrary value.

The output circuit 115 is composed of the four AND gate circuits 1151, 1152, 1153, and 1154 corresponding to the bit number (4 bits) of the provisional index A'. The bits a1', a2', a3', and a4' of the provisional index A' may be supplied to the first input of the AND gate circuits 1151, 1152, 1153, and 1154, respectively. In addition, the match signals MTi may be commonly supplied to the second inputs of the AND gate circuits 1151, 1152, 1153, and 1154, respectively.

According to the configuration of the output circuit 115 described above, if the value of the match signal MTi is "1" (high level), the AND gate circuits 1151, 1152, 1153, and 1154 may produce the bits a1', a2', a3', and a4' of the provisional index A' as the values of the bits a1$i$, a2$i$, a3$i$, and a4$i$ of the specific index Ai as it is. Also, if the value of the match signal MTi is "0" (low level), the AND gate circuits 1151, 1152, 1153, and 1154 may produce the signal of the value "0" (low level) regardless of the value of the bits a1', a2', a3', and a4' of the provisional index A', and the values of the bits a1$i$, a2$i$, a3$i$, and a4$i$ of the specific index Ai may be all "0". This is a signal indicating the invalid value.

Figure 4C:
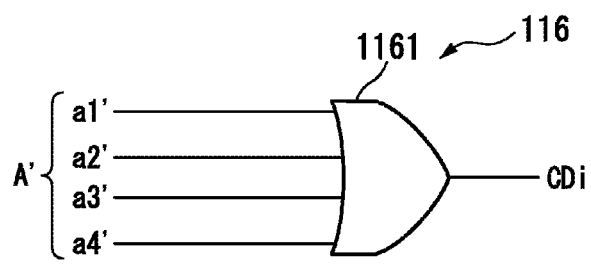
FIG. 4C is a diagram showing an example of a configuration of a collision signal generation circuit of the index generator provided in the content addressable memory according to the first embodiment of the present invention.

Next, the configuration of the collision signal generation circuit 116 provided in the index generator 110-$i$ shown in FIG. 2 will be described. FIG. 4C is a diagram showing a configuration example of the collision signal generation circuit 116 of the index generator 110-$i$ provided in the content addressable memory 100 according to the first embodiment of the present invention. Also in this example, it is assumed that the provisional index A' is represented by the 4 bits (a1', a2', a3', and a4') considering k=15.

The collision signal generation circuit 116 is composed of a 4-input OR-gate circuit 1161 corresponding to the bit number (4 bits) of the provisional index A'. The OR-gate circuit 1161 may compute a logical disjunction of the bits a1', a2', a3', and a4' of the provisional index A' and may produce the result of the computation as a collision signal CDi. If the value of "1" is included in any of the bits a1', a2', a3', and a4' of the provisional index A', the collision signal generation circuit 116 may produce the high-level logic signal indicating the value of "1" as the collision signal CDi. The value "1" of the collision signal CDi may indicate that the hash collision may occur in the update mode. On the other hand, if all the values of the bits a1', a2', a3', and a4' of the provisional index A' are "0", that is, if the provisional index A' indicates the invalid value, the collision signal generation circuit 116 may produce a low-level logic signal indicating the value "0" as the collision signal CDi. The value "0" of the collision signal CDi may indicate that the hash collision has not occurred in the update mode. The configuration of the index generator 110-$i$ provided in the content addressable memory 100 shown in FIG. 1 has been described above.

Figures 5, 6:
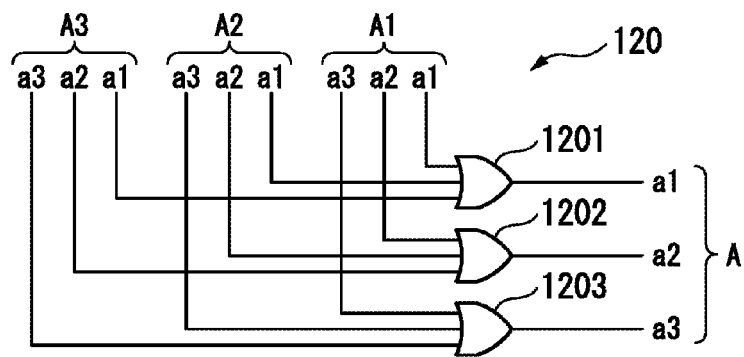
FIG. 5 is a diagram showing an example of a configuration of a circuitry of an output unit provided in the content addressable memory according to the first embodiment of the present invention.
FIG. 6 is a diagram showing an example of registered information registered in the content addressable memory according to the first embodiment of the present invention.

Next, the configuration of the output unit 120 provided in the content addressable memory 100 shown in FIG. 1 will be described. FIG. 5 is a diagram showing a circuit configuration example of the output unit 120 provided in the content addressable memory 100 according to the first embodiment of the present invention. The output unit 120 is composed of the three OR-gate circuits 1201, 1202, and 1203 corresponding to the number of the index generators 110-1, 110-2, and 110-3. The bit a1 of the index A1 produced by the index generator 110-1, the bit a1 of the index A2 produced by the index generator 110-2, and the bit a1 of the index A3 produced by the index generator 110-3 may be supplied to the input terminals of the OR-gate circuit 1201. The OR-gate circuit 1201 may compute the logical disjunction of the bits a1 inputs from the index generators 110-1, 110-2, and 110-3, respectively, and may produce the result of the computation as the value of the bit a1 of the index A.

The bit a2 of the index A1 produce by the index generator 110-1, the bit a2 of the index A2 produced by the index generator 110-2, and the bit a2 of the index A3 produced by the index generator 110-3 may be supplied to the input terminals of the OR-gate circuit 1202. The OR-gate circuit 1202 may compute the logical disjunction of the bits a2 inputs from the index generators 110-1, 110-2, and 110-3, and may produce the result of the computation as the value of the bit a2 of the index A.

Further, the bit a3 of the index A1 produced by the index generator 110-1, the bit a3 of the index A2 produced by the index generator 110-2, and the bit a3 of the index A3 produced by the index generator 110-3 may be supplied to the input terminals of the OR-gate circuit 1203. The OR-gate circuit 1203 may compute the logical disjunction of the bits a3 inputs from the index generators 110-1, 110-2, and 110-3, and may produce the result of the computation as the value of the bit a3 of the index A.

The output unit 120 may combine corresponding bits of the indices A1, A2, and A3 produced by the index generators 110-1, 110-2, and 110-3 and may generate and produce the index A by executing the above logical operation. Here, in the course of the logical operation, at most one index generator may generate the valid values and the other index generators may generate the invalid values from the circuit construction method. Therefore, according to the above configuration, the only valid values are produced as the index A from the output unit 120. Note that if the provisional index A' in which all the bits are "1" is defined as the invalid value, the output unit 120 may provide the AND-gate circuit for performing a AND operation instead of the OR-gate circuits 1201, 1202, and 1203.

Next, the registered information realized by the content addressable memory 100 will now be described with reference to FIGS. 6 to 10. FIG. 6 is the diagram showing an example of the registered information registered in the content addressable memory 100 according to the first embodiment of the present invention. The registered information in FIG. 6 may specify the relationship between each value of the input vector X (x1, x2, x3, x4, x5, x6) and the value of the index IDX indicating the specific index A of the input vector X, where n=6, k=15, X1=(x1, x2, x3), and X2=(x4, x5, x6). For example, for the value (0, 1, 1, 0, 0, and 0) of the input vector X (x1, x2, x3, x4, x5, x6), the value "1" is associated with the value of the input vector X as the value of the index IDX indicating the specific index A.

The hash function realized in each of the hash circuits 111 of the index generators 110-1, 110-2 and 110-3 may be set in accordance with the content of the registered vector so as to express the signature that significantly clearly distinguishes the registered vector registered in the registered information by a p bits vector Y1 whose number of the bits is smaller than the bit number n of the input vector X. In the example of FIG. 6, when attention is paid to the value of the bit x1 of the X1, the value of the bit x1 of the registered vector respectively associated with the values "1" and "2" of the index IDX are both "0". Therefore, it is impossible to distinguish the registered vectors respectively associated with the values "1" and "2" of the index IDX using only the bit x1. Therefore, paying attention to the bit x2, the value of the bit x2 of the registered vector respectively associated with the values "1" and "2" of the index IDX are both "1". Therefore, even if the attention is paid to the two bits of the bit x1 and the bit x2, the registered vectors respectively associated with the values "1" and "2" of the index IDX cannot be distinguished.

Therefore, paying attention to the bit x3, the value of the bit x3 of the registered vector associated with the value "1" of the index IDX is "1", and the value of the bit x3 of the registered vector associated with the value "2" of the index IDX is "0". Thus, paying attention to the bit x3, it is possible to distinguish the registered vectors associated with the values "1" and "2" of the index IDX. That is, the signatures of the registered vectors corresponding to the values "1" and "2" of the index IDX can be expressed using the bits x1, x2, x3 of the X1. In this example, however, it can be distinguished the registered vectors corresponding to the values "1" and "2" of the index IDX from only the bits x2 and x3, and the value of the bits x2 and x3 may also be used as the signature of the registered vectors in this case. In this way, a set of the index IDX corresponding to the registered vector distinguishable by X1 is acquired.

In the first embodiment, the registered information defining the correspondence between the registered vectors distinguishable using the X1 and the index IDX among the registered information shown in FIG. 6 may be realized in the first index generator 110-1 among the three index generators 110-1, 110-2, and 110-3.

Figure 7:
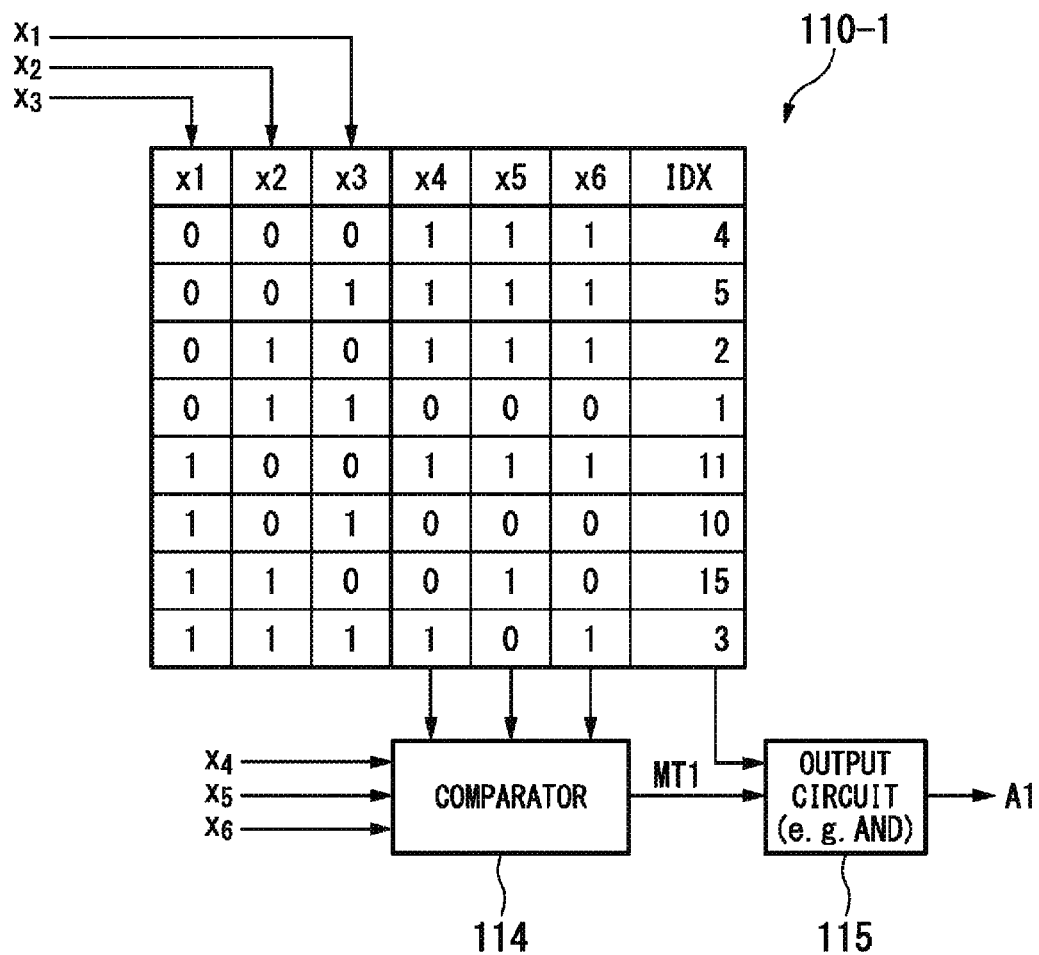
FIG. 7 is a diagram for describing registered information realized by the first index generator provided in the content addressable memory according to the first embodiment of the present invention.

FIG. 7 is a diagram for explaining the registered information realized by the first index generator 110-1 included in the content addressable memory 100 according to the first embodiment of the present invention. As shown in FIG. 7, the registered information realized by the index generator 110-1 may be determined so that the correspondence between the eight values "4", "5", "2", "1", "11", "10", "15", and "3", and the values of the bits (x1, x2, x3, x4, x5, x6) of the eight registered vectors corresponding to the values of these index IDX is defined.

When the registered information to be realized by the index generator 110-1 may be determined, the hash function to be realized by the hash circuit 111 of the index generator 110-1 may be set in order to acquire the bits x1, x2, and x3 necessary for clearly distinguishing the registered vectors of the registered information from the input vector X. In order to realize such hash function, as described above, the hash circuit 111 (i=1) of the index generator 110-1 may supply the X1 (x1, x2, x3) among the bits x1, x2, x3, x4, x5, x6 of the input vector X to the provisional index generation circuit 112 as the vector Y1 (y1, y2, y3).

Here, each value of the index IDX associated with the bits x1, x2, x3 of the registered vector among the registered information shown in FIG. 7, may be stored in the main storage of the provisional index generation circuit 112 of the index generator 110-1 as the provisional index A'. In this case, the provisional index A' indicating the index IDX may be stored in the memory cell specified by the bits x1, x2, x3 of the registered vector corresponding to the index IDX. Thus, the registered vector and the index IDX are associated with each other and stored as the registered information in the main storage of the provisional index generation circuit 112.

Further, among the registered information shown in FIG. 7, each value of the bits x1, x2, x3, x4, x5, x6 of the registered vector may be stored in the secondary storage of the regenerated vector generation circuit 113. That is, the index IDX may be supplied as the q bits provisional index A' from the provisional index generation circuit 112 to the regenerated vector generation circuit 113, and each value of the bits x1, x2, x3, x4, x5, x6 of the registered vector may be stored in the memory cell of the secondary storage specified by the provisional index A'. Thus, the value of each bit of the registered vector may be stored in the secondary storage of the regenerated vector generation circuit 113 as the registered information associated with the provisional index A'. However, as described above, when the linear function is used as the hash function, it may not be necessary to store all the bits of the registered vector in the secondary storage of the regenerated vector generation circuit 113. It may be necessary to store a part of the bits x4, x5, x6 of the regenerated vector in the secondary storage of the regenerated vector generation circuit 113.

In the index generator 110-1 described above, when the input vector X may be supplied in the search mode, if the value of the bits x4, x5, x6 among all the bits of the input vector X matches the stored value stored in the memory configuring the secondary storage of the regenerated vector generation circuit 113, the value of the match signal MT1 of the comparator 114 becomes "1", and the value of the index IDX may be produced as the index A1. If the values of the bits x4, x5, x6 of the input vector X do not match the values stored in the memory configuring the above secondary storage, the value of match signal MT1 of the comparator 114 becomes "0" and the invalid value may be produced as the index A1 indicating the value of the index IDX. In this case, all the bits of the index A1 produced by the index generator 110-1 may become "0".

As described above, in the index generator 110-1, the registered information defining the correspondence between the eight values "4", "5", "2", "1", "11", "10", "15", and "3" and the registered vectors corresponding to the values of the index IDX among the registered information shown in FIG. 6 described above are realized. However, the remaining seven values "7", "9", "13", "14", "12", "6", and "8" of the index IDX cannot be realized by the index generator 110-1.

Therefore, in the second index generator 110-2, paying attention to the bits x4, x5, x6 of the registered vector of the registered information, the registered information defining the correspondence between the five registered values "7", "13", "12", "6", "8" of the index IDX and the registered vectors corresponding to the values of the index IDX among the registered information shown in FIG. 6 described above are realized. In this case, using the bits x4, x5, x6 of the X2 of the registered vector, the index IDX of the registered information realized by the index generator 110-2 may be determined.

Figure 8:
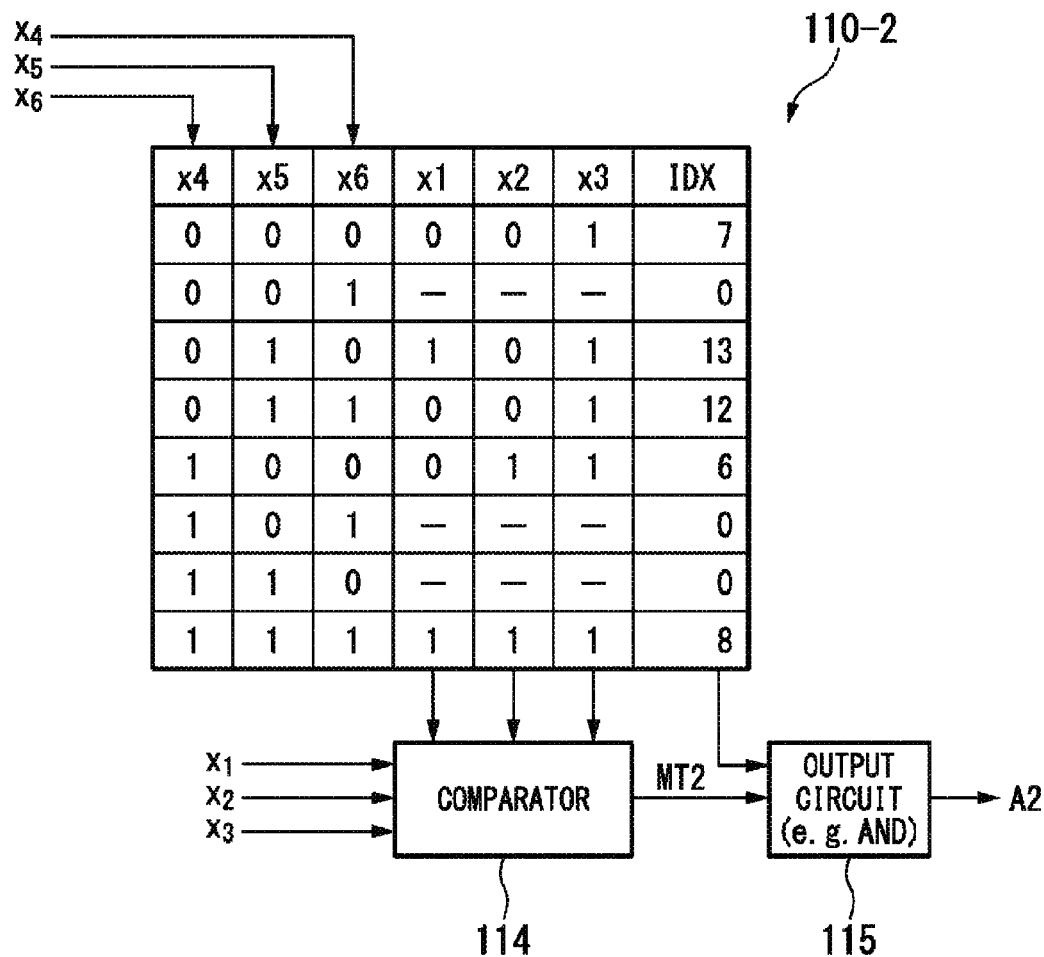
FIG. 8 is a diagram for describing registered information realized by the second index generator provided in the content addressable memory according to the first embodiment of the present invention.

FIG. 8 is a diagram for explaining the registered information realized by the second index generator 110-2 included in the content addressable memory 100 according to the first embodiment of the present invention. In this example, the registered information for the five values "7", "13", "12", "6", and "8" of the index IDX among the registered information shown in FIG. 6 may be realized. However, the remaining two values "9" and "14" of the index IDX cannot be realized by the index generator 110-2. In the example shown in FIG. 8, if the values of the bits x1, x2, x3 among all the bits of the input vector X match the values stored in the memory configuring the secondary storage of the regenerated vector generation circuit 113, the value of the match signal MT2 of the comparator 114 may be "1".

Finally, in the third index generator 110-3, as described with reference to FIG. 3C, the registered information for the values "9" and "14" of the remaining index IDX may be stored in each memory cell of the main storage and the secondary storage specified by the values of the bits y1, y2, y3 acquired as the result of the computation of the exclusive-OR of the bits x1, x2, x3, and the bits x4, x5, x6 of the registered vector of registered information. In this case, the index IDX of the registered information to be realized by the index generator 110-3 may be determined by using the bits y1, y2, y3 acquired as the result of the computation of the exclusive-OR of the bits x1, x2, x3 and the bits x4, x5, x6 of the registered vector of the registered information.

Figure 9:
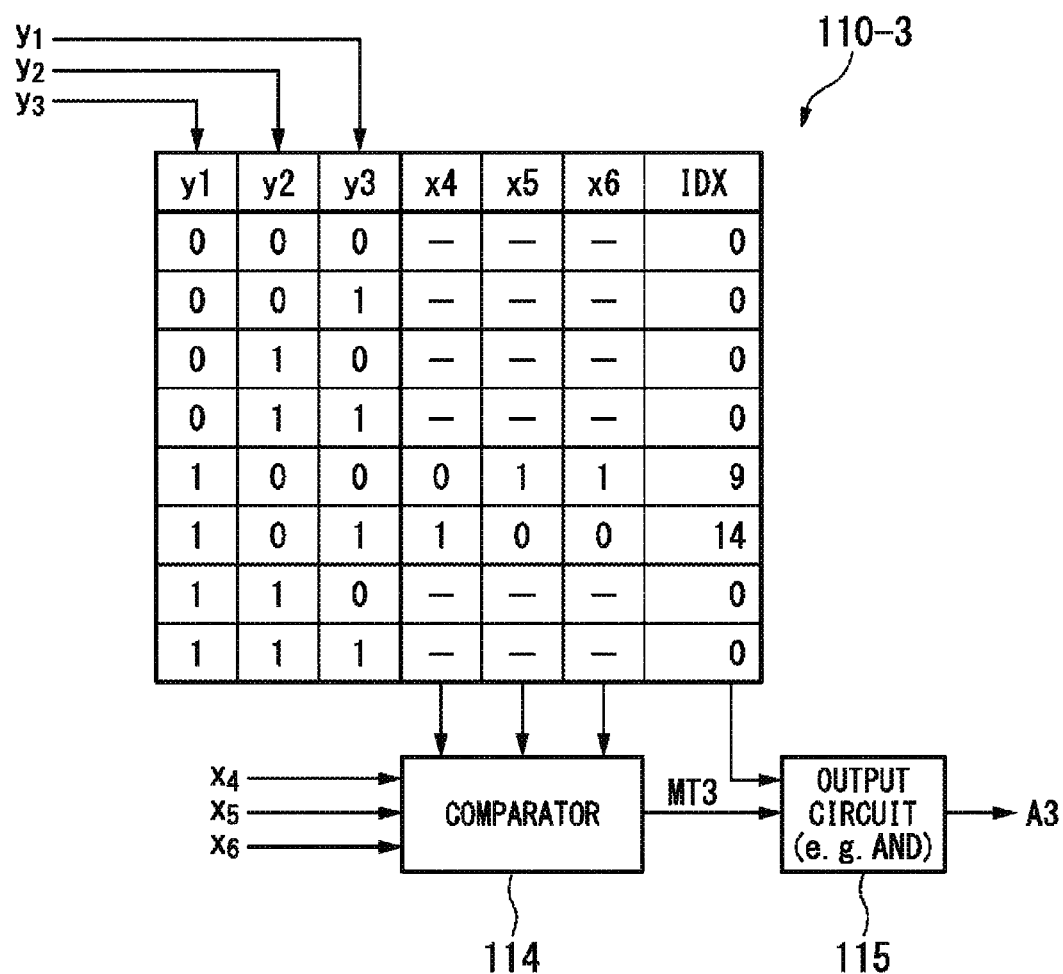
FIG. 9 is a diagram for describing registered information realized by the third index generator provided in the content addressable memory according to the first embodiment of the present invention.

FIG. 9 is the diagram for explaining the registered information realized by the third index generator 110-3 included in the content addressable memory 100 according to the first embodiment of the present invention. In this example, the registered information for the two values "9" and "14" of the index IDX among the registered information shown in FIG. 6 may be realized. In this case, the information for the values "9" and "14" of the index IDX among the registered information may be stored in the memory cell of the main storage of the provisional index generation circuit 112 specified by the values of the bits y1, y2, y3. In addition, each value of the bits (y1, y2, y3, x4, x5, x6) of the registered vectors corresponding to the values "9" and "14" of the index IDX may be stored in the memory cell of the secondary storage of the regenerated vector generation circuit 113 specified by the provisional index A' indicating the values "9" and "14" of the index IDX. In the example shown in FIG. 9, if the values of the bits x4, x5, x6 among all the bits of the input vector X match the values stored in the memory configuring the secondary storage of the regenerated vector generation circuit 113, the value of the match signal MT3 of the comparator 114 may become "1".

Thus, even if the hash collision occurs in each of the index generators, all of the registered information for the 15 indices shown in FIG. 6 may be realized by using the three index generators 110-1, 110-2, and 110-3.

2. Description of the Operation

Next, the operation in the normal search mode of the content addressable memory 100 according to the first embodiment will be described. When the operating in the normal search mode, one index generator 110-$i$ among the three index generators 110-1, 110-2, and 110-3 may produce the index Ai indicating the valid value in the response to the input vector X. Other two index generators 110-$i$ may produce the invalid value. The output unit 120 may combine the indices A1, A2, and A3, respectively produced by the three index generators 110-1, 110-2, and 110-3 to generate and produce the index A. The index A has the same value as the index Ai indicating the valid value out of the indices A1, A2, and A3 produced by the three index generators 110-1, 110-2, and 110-3. If the input vector X does not match any of the registered vectors set in the index generators 110-1, 110-2, and 110-3, all the index generators 110-1, 110-2 and 110-3 may generate the invalid values.

As described above, in the normal search mode, the specific index A corresponding to the input vector X is acquired from any of the three index generators 110-1, 110-2, and 110-3, and the index A may be produced by the output unit 120. Therefore, in the search mode, the three index generators 110-1, 110-2, and 110-3 and the output unit 120 are integrated to function as one CAM.

Next, the operation in the update mode of the content addressable memory 100 will be described. As an operation in the update mode, there are an operation of deleting existing registered information, and an operation of adding new registered information. In the update mode, if the registered vector exists as the registered information, the controller 130 may delete the index corresponding to the existing registered vector and then add the index of a new registered vector as the registered information, and thereby the controller 130 may update the registered information. The operation for updating the registered information in the update mode may be controlled by the controller 130.

2-1. Operation to Delete the Existing Registered Information

Figure 13:
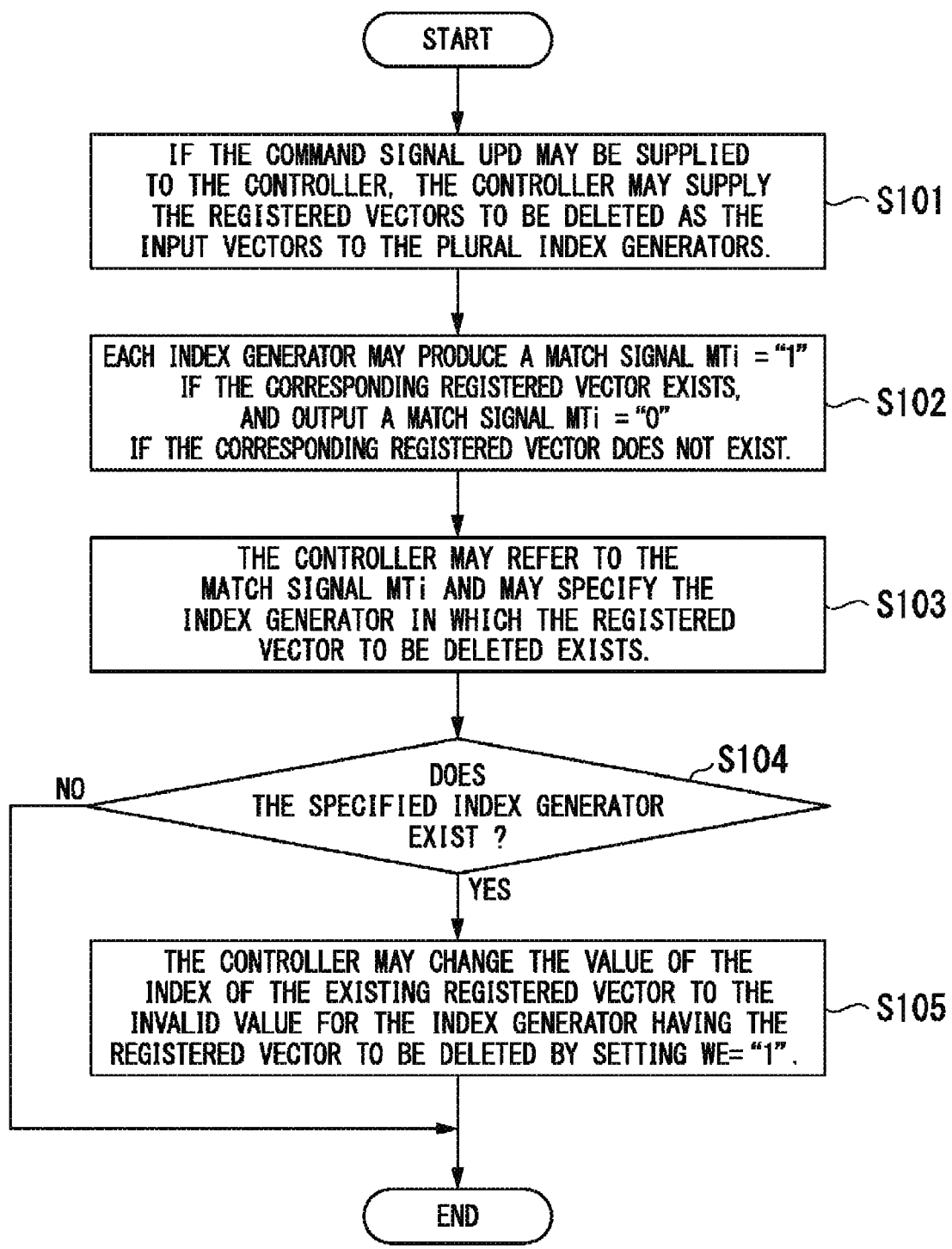
FIG. 13 is a flowchart showing an example of a deletion method of the registered information according to the first embodiment of the present invention.

Here, with reference to FIG. 13, an example of the operation of deleting the existing registered information by the above-mentioned controller 130 will be described. FIG. 13 is the flowchart showing an example of a deletion method of the registered information according to the first embodiment of the present invention. In the case of deleting the existing registered information, a command signal UPD indicating an activation of the update mode may be supplied from a system (not shown) managing the content addressable memory 100 to the controller 130 of the content addressable memory 100. As shown in FIG. 13, if the command signal UPD may be supplied to the controller 130, the controller 130 may supply the registered vectors to be deleted as the input vectors to the plural index generators 110-$i$ (step S101). That is, the registered vectors to be deleted are commonly supplied as the input vector X to the three index generators 110-1, 110-2, and 110-3.

Next, each index generator 110-$i$ may produce a match signal MTi="1" if the corresponding registered vector exists. In addition, each index generator 110-$i$ may produce a match signal MTi="0" if the corresponding registered vector does not exist (step S102). That is, the index generators 110-1, 110-2, and 110-3 may respectively supply signals having the value "1" as the match signals MT1, MT2, and MT3 to the controller 130 if the corresponding registered information exists. The index generators 110-1, 110-2, and 110-3 may respectively supply signals having the value "0" as the match signals MT1, MT2, and MT3 to the controller 130 if the corresponding registered information does not exist.

Next, the controller 130 may refer to the match signal MTi and may specify the index generator 110-$i$ in which the registered vector to be deleted exists (step S103). That is, the controller 130 may refer to the values of the match signals MT1, MT2, and MT3 respectively supplied from the index generators 110-1, 110-2, and 110-3, and may specify the index generator in which the registered vectors to be deleted exist. Here, since the collision occurs if the registered vector to be deleted exists, the collision signal CDi and the match signal MTi may indicate the value "1". It is possible to specify the index generator corresponding to the registered vector to be deleted from this match signal MTi.

Next, the controller 130 may determine whether or not the specified index generator 110-$i$ exists (step S104). If the specified index generator 110-$i$ exists (step S 104: YES), the controller 130 may advance the process to step S105. If the specified index generator 110-$i$ does not exist (step S104: NO), the controller 130 may terminate the process.

In step S105, the controller 130 may change the value of the index of the existing registered vector to the invalid value by setting to WE="1" for the index generator 110-$i$ having the registered vector to be deleted. That is, the controller 130 may set the main storage and the secondary storage of the index generator corresponding to the registered index to be deleted among the three index generators 110-1, 110-2, and 110-3 to the write mode by using the write enable signal WE for controlling the writing operation and may delete the registered information stored in these storage. Specifically, the controller 130 may rewrite the value of the provisional index stored in the main storage of the index generator 110-$i$ stored in the registered index to be deleted from the valid value to the invalid value.

For example, when the controller 130 rewrites the index IDX for the registered vector (x1, x2, x3)=(0, 1, 1) of the index generator 110-1 to the invalid value, the controller 130 may rewrite the contents of the index IDX in the address (0, 1, 1) of the memory configuring the main storage of the index generator 110-1 to the value (0, 0, 0). As a result, the registered information for the registered vector supplied from the system to the controller 130 may be deleted.

To summarize the operations related to the deletion of the above-mentioned registered information, in a case of deleting the index corresponding to the existing registered vector registered as the registered information, the controller 130 may select the index generator among the plural index generators 110-1, 110-2, and 110-3 that supplies the match signal MTi indicating that the regenerated vector X2' generated by using the index of the registered vector to be deleted matches the X2 of the input vector X. The controller 130 may delete the index of the existing registered vector from the registered information of the selected index generator.

In the case of deleting the registered information in the update mode, the control by the controller 130 may include the following the first to the third stages.

The first stage: In the update mode, the controller 130 may supply the existing registered vectors to be deleted as the input vector X to the plural index generators 110-1, 110-2, and 110-3.

The second stage: For each of the plural index generators 110-1, 110-2, and 110-3, the controller 130 may determine whether the specific index corresponding to the existing registered vector to be deleted based on the match signal MTi exists as the registered information.

The third stage: In any of the plural index generators 110-1, 110-2, and 110-3, if the specific index corresponding to the existing registered vector exists as the registered information, the controller 130 may change the value of the index of the existing registered vector existing as the registered information from the valid value to the invalid value.

In this way, in the case of deleting the existing registered information, the controller 130 may specify the index generator storing the existing registered vector to be deleted from the value of the match signal MTi, and the controller 130 may directly access the main storage and the secondary storage of each index generator, as a result, the controller 130 can delete the registered information at high speed. Therefore, it is possible to execute the updating operation accompanied by deletion of the existing registered information at high speed.

2-2. Operation to Add New Registered Information

Figure 14:
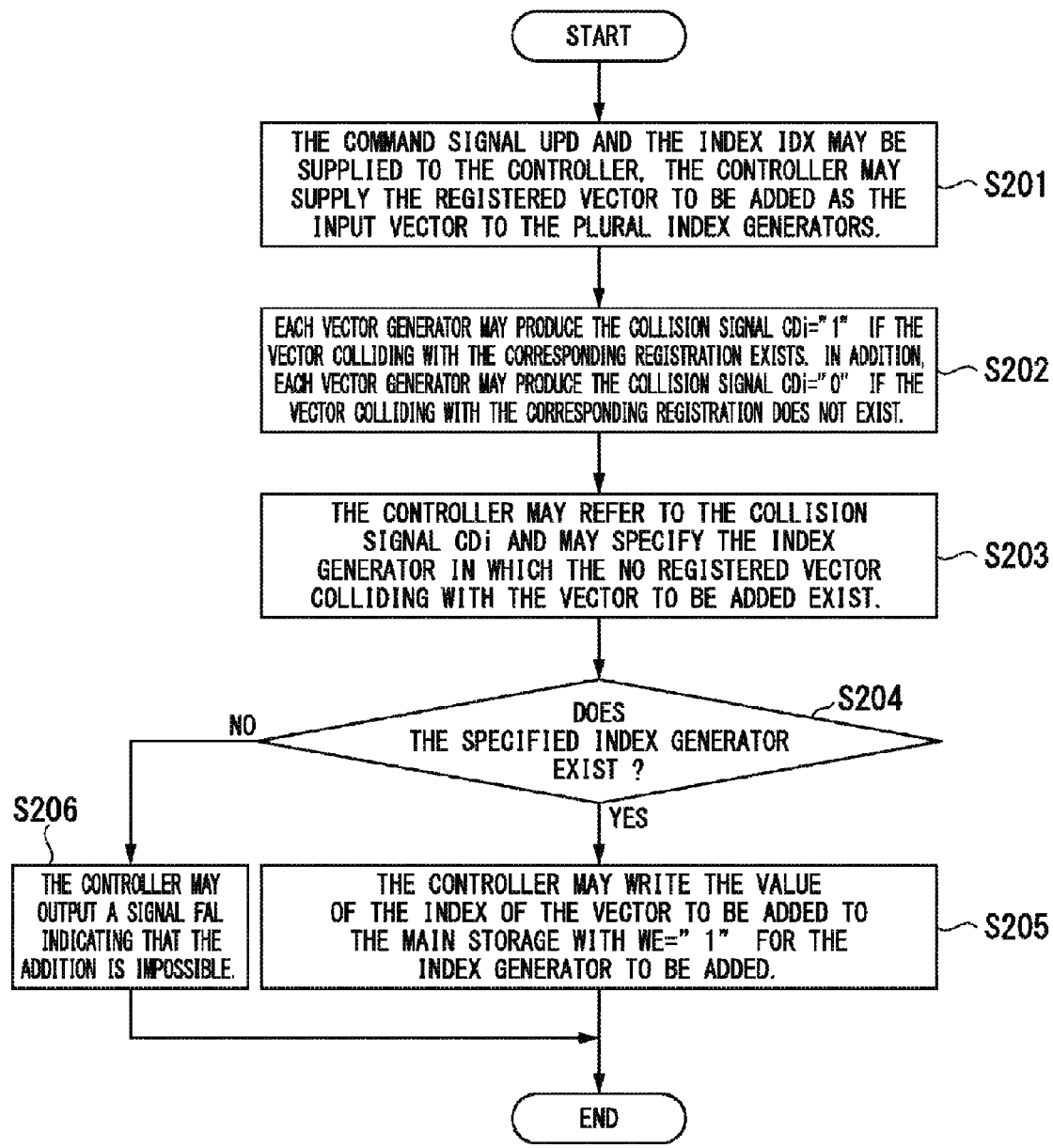
FIG. 14 is a flowchart showing an example of an addition method of new information according to the first embodiment of the present invention.

An example of the operation of adding the new registered information by the above-mentioned controller 130 will be described with reference to FIG. 14. FIG. 14 is a flowchart showing an example of an adding method of new information according to the first embodiment of the present invention. In the case that the new registered vector may be added, a command signal UPD indicating an activation of an update mode may be supplied from the system managing the content addressable memory 100 to the controller 130 of the content addressable memory 100. Also, the index ID of the registered vector to be added may be supplied from the system. As shown in FIG. 14, if the command signal UPD and the index IDX may be supplied to the controller 130, the controller 130 may supply the additional registered vector as the input vector to the plural index generators 110-i (step S201). That is, the registered vectors to be added are supplied as the input vector X to the three index generators 110-1, 110-2, and 110-3.

Next, each vector generator 110-i may produce the collision signal CDi="1" if the vector colliding with the corresponding registration. In addition, each index generator 110-i may produce the collision signal CDi="0" if the vector colliding with the corresponding registration does not exist (step S202). In other words, if the provisional index A' of the corresponding registered information exists, the index generators 110-1, 110-2, and 110-3 may respectively supply signals of the value"1" to the controller 130 as the collision signals CD1, CD2 and CD3. If the corresponding registered information does not exist, the index generators 110-1, 110-2, and 110-3 may respectively supply a signal of the value "0" to the controller 130 as the collision signals CD1, CD2, and CD 3.

Next, the controller 130 may refer to the collision signal CDi and may specify the index generator 110-i in which the registered vector colliding with the vector to be additionally registered does not exist (step S203). That is, the controller 130 may refer to the value of the collision signals CD1, CD2, and CD3 respectively supplied from the index generators 110-1, 110-2, and 110-3 and may specify an index generator capable of registering a registered vector to be added is specified. Here, the registered vector colliding with the registered vector to be added, as a result, the hash collision occurs, so that the collision signal CDi may indicate the value "1". It is possible to specify an index generator that may add a registered vector from the values of the collision signal CDi.

Next, the controller 130 may determine whether the specified index generator 110-i exists (step S204). If the specified index generator 110-i exists (step S204: YES), the controller 130 proceeds the process to step S205. If the specified index generator 110-i does not exist (step S204: NO), the controller 130 proceeds the process to step S 206.

In step S205, the controller 130 may write the value of the index of the vector to be additionally registered in the main storage with WE="1" for the index generator 110-i to be additionally registered. That is, the controller 130 may use the write enable signal WE to set the main storage and the secondary storage of the index generator in which the registered vector colliding the registered vector to be added does not exist among the three index generator 110-1, 110-2, and 110-3 to the write mode, and then add the new registered information to these storages.

Specifically, the controller 130 may write the valid value of the provisional index to the main storage of the index generator in which the registered vector colliding with the registered vector to be added does not exist. For example, if the registered vector colliding with the registered vector to be added to the index generator 110-3 does not exist, the controller 130 may write the valid value of the index to the address (y1, y2, y3)=(1, 1, 0) of the memory configuring the main storage of the index generator 110-3.

As a result, the registered information for the registered vector supplied from the system to the controller 130 may be added to the content addressable memory 100.

In step S206, the controller 130 may produce a signal FAL indicating that the addition is impossible. That is, if the registered vectors in which all of the three index generators 110-1, 110-2, and 110-3 collides with the registered vector to be added, the controller 130 does not add the new registered information. In this case, the controller 130 may produce the signal FAL indicating that the addition is impossible.

To summarize the operations related to the addition of the registered information, when adding the index of the new registered vector as the registered information, the controller 130 may select the index generator that supplies the collision signal CDi indicating that the new registered vector is not stored as the registered information among the plural index generators 110-1, 110-2, and 110-3.

The controller 130 may add the index of the new registered vector to be added as the registered information of the selected index generator.

In the case where the provisional index corresponding to the new registered vector to be added may be stored as the registered information in any of the plural index generators 110-1, 110-2, and 110-3, the controller 130 may set the valid value as the value of the index corresponding to the new registered vector in another index generator where the provisional index corresponding to the new registered vector does not exist.

When the registered information may be added in the update mode, the control by the controller 130 includes the first to the third stages.

The first stage: The controller 130 may supply the new registered vector to be added as the input vector X to the plural index generators 110-1, 110-2, and 110-3.

The second stage: The controller 130 may determine whether the provisional index corresponding to the new registered vector to be added exists as the registered information for each of the plural index generators 110-1, 110-2, and 110-3 based on the collision signal CDi.

The third stage: If any provisional index corresponding to the new registered vector does not exist as the registered information in any of the plural index generators 110-1, 110-2, and 110-3, the controller 130 may set the valid value as the value of the index corresponding to the new registered vector.

In this way, when the new registered information may be added, the controller 130 may specify the index generator that does not collide with the registered vector to be added from the value of the match signal MTi, and the controller 130 may directly access the main storage and the secondary storage of the index generator to add the registered information, as a result, it is possible to add the registered information at high speed. Therefore, it is possible to perform the update operation accompanied by the addition of the new registered information at high speed.

As described above, according to the first embodiment, the signature of the input vector is extracted by using the plural hash functions and the provisional index A' is generated based on the signature in the plural index generators 110-1, 110-2, and 110-3. As a result, even if the hash collision caused by the hash function occurs, the registered information can be realized on the content addressable memory 100 by using the general-purpose semiconductor memory while avoiding the hash collision.

Further, the hash circuit 111 provided in each of the plural index generators 110-1, 110-2, 110-3, . . . , and 110-N may generate the vector Y1 of the p bits whose bit size is smaller than the bit number n of the input vector X. As a result, it can reduce the address space of the memory configuring the main storage of the provisional index generation circuit 112 in which the vector Y1 is inserted as an address. Therefore, the storage capacity of the semiconductor memory configuring the main storage can be reduced.

Furthermore, because the hash circuit 111 may extract the signature of the input vector X by using the linear function as the hash function, the values of the (n-p) bits of a part of the registered vector may be stored in the secondary storage of the regenerated vector generation circuit 113 as the value of the registered vector. Therefore, it is possible to effectively reduce the storage capacity of the semiconductor memory configuring the secondary storage of the regenerated vector generation circuit 113. Therefore, according to the first embodiment, it is possible to increase the storage capacity of the content addressable memory 100 while suppressing the increase of the bit cost and power consumption.

According to the first embodiment, the collision signal CDi and the match signal MTi may be generated in each of the plural index generators 110-1, 110-2, and 110-3, and these signals may be supplied to the controller 130. As a result, in the update mode, the controller 130 can directly access the index generator having the registered information to be deleted and the index generator capable of adding the registered information by referring to the collision signal CDi and the match signal MTi. And as a result, it can update the registered information. Therefore, it is possible to accelerate the update of the registered information.

The Second Embodiment

Figure 10:
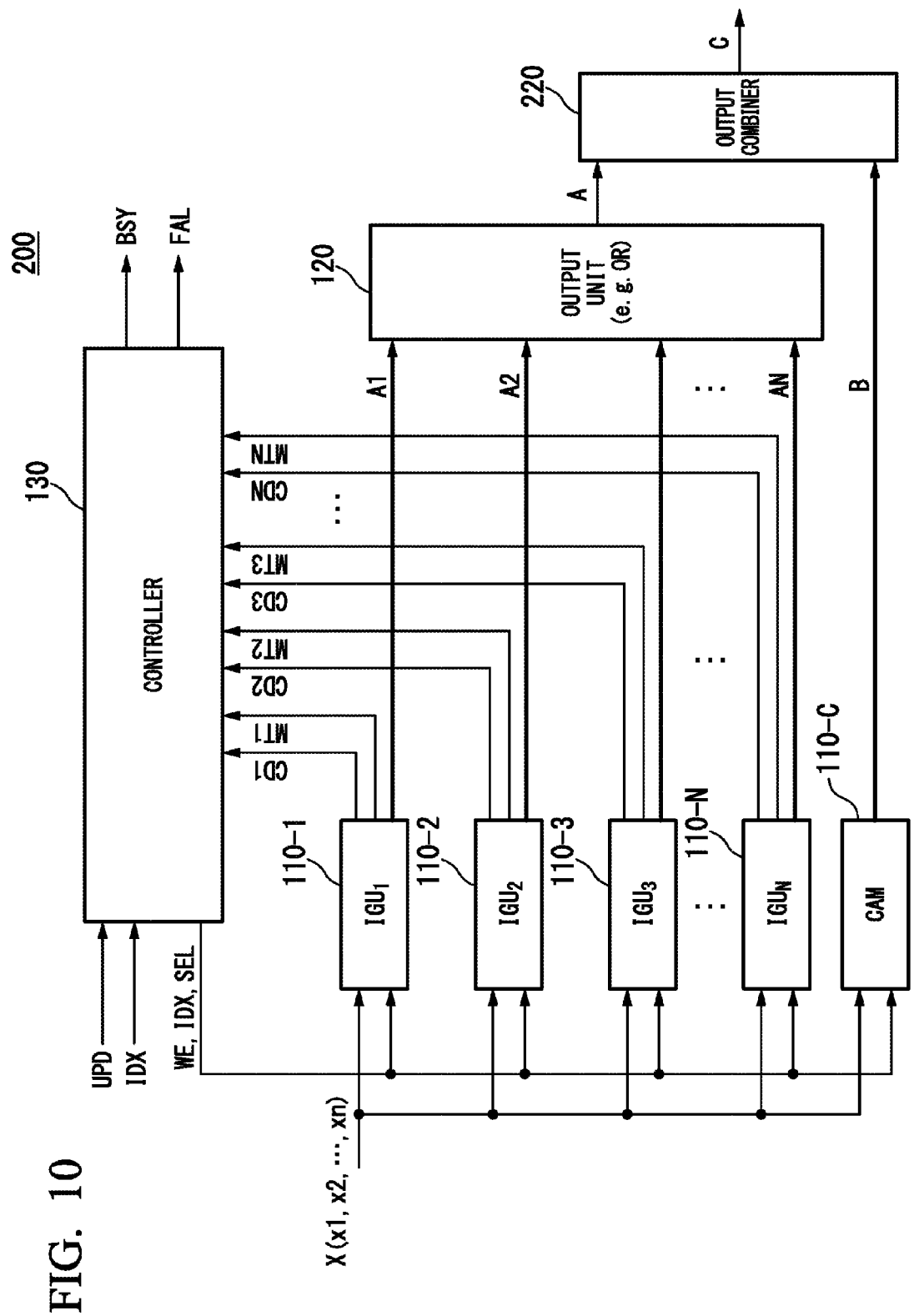
FIG. 10 is a block diagram showing an example of a configuration of the content addressable memory according to the second embodiment of the present invention.

Next, the second embodiment of the present invention will be described. FIG. 10 is a block diagram showing a configuration example of the content addressable memory 200 according to the second embodiment of the present invention.

The content addressable memory 200 may include a CAM 110-C in addition to the plural index generators 110-1, 110-2, 110-3, . . . , and 110-N in the configuration of the content addressable memory 100 shown in FIG. 1 according to the aforementioned first embodiment, or in place of a part of the index generators among the index generators 110-1, 110-2, 110-3, . . . , and 110-N. The CAM 110-C is a content search type semiconductor memory having the CAM cell, and it is possible to use such as a conventional CAM. The operation of the CAM 110-C (an operation in search mode and update mode) may be controlled by the controller 130.

The content addressable memory 200 may further include an output combiner 220. The output combiner 220 may combine the index A produced by the output unit 120 provided in the content addressable memory 100 and the index B produced by the CAM 110-C according to the first embodiment to produce the index C. The output combiner 220 may produce either the index A produced by the output unit 120 or the index B produced by the CAM 110-C. The output combiner 220 may include the OR-gate circuit similarly to the output unit 120 shown in FIG. 5. The others are the same as in the first embodiment.

Figure 11:
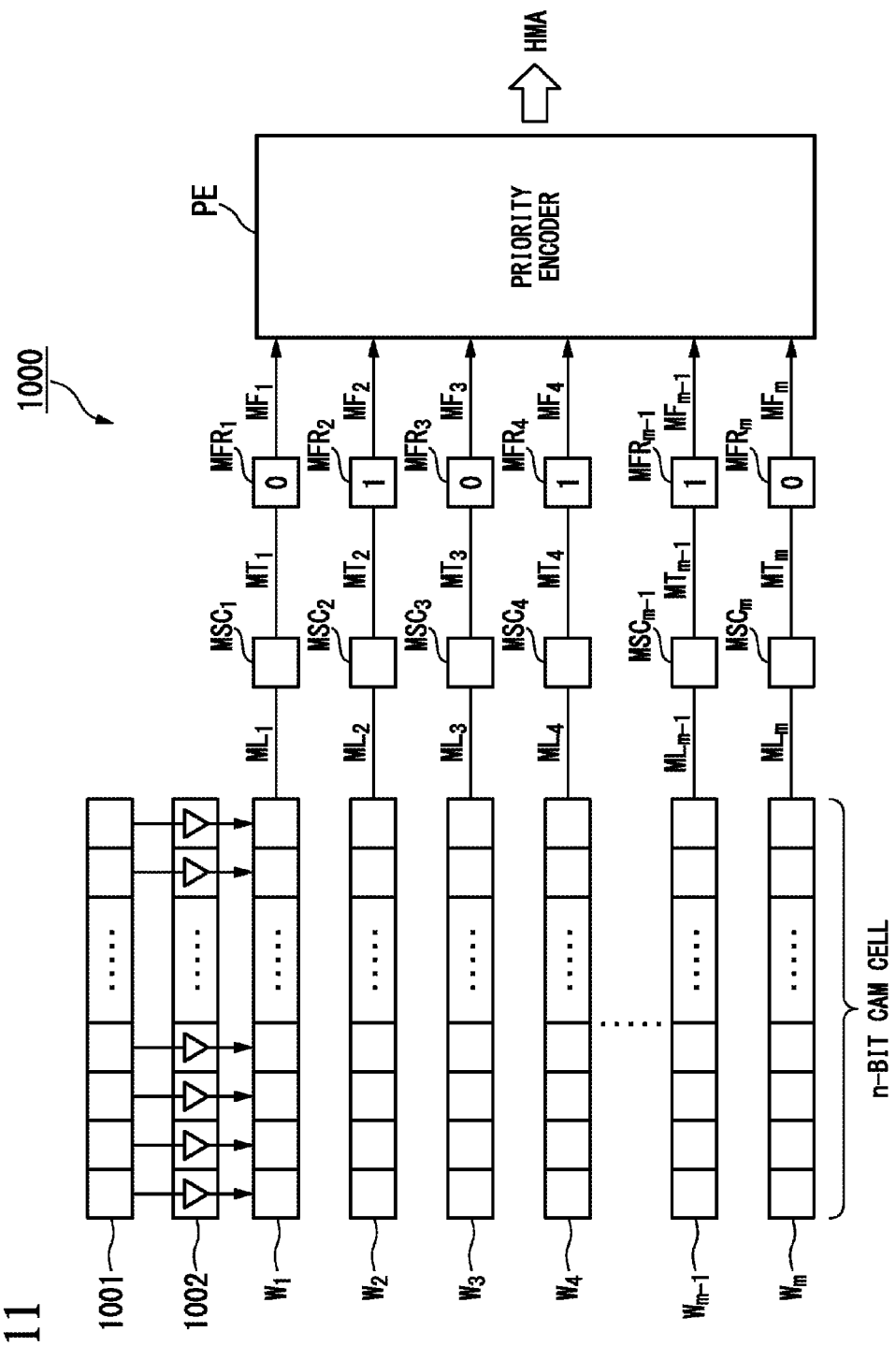
FIG. 11 is a block diagram showing an example of a basic configuration of the CAM provided in the content addressable memory according to the second embodiment of the present invention.

Next, the CAM 110-C provided in the content addressable memory 200 will be described with reference to FIG. 11 and FIG. 12. FIG. 11 is a block diagram showing an example of a basic configuration of a conventional CAM 1000 used as the CAM 110-C provided in the content addressable memory 200 according to the second embodiment of the present invention (see Patent Reference). The CAM 1000 may include a comparison register 1001, a search bit line driver 1002, m words W1 to Wm, m match sense circuits MSC1 to MSCm, m match flag registers MFR1 to MFRm, and a priority encoder circuit PE.

The comparison register 1001 is a register for storing n-bits search data. The search bit line driver 1002 may drive each bit of the comparison register 1001 on the search bit line. Each of the words W1 to Wm may include n-bits CAM cells.

Figure 12:
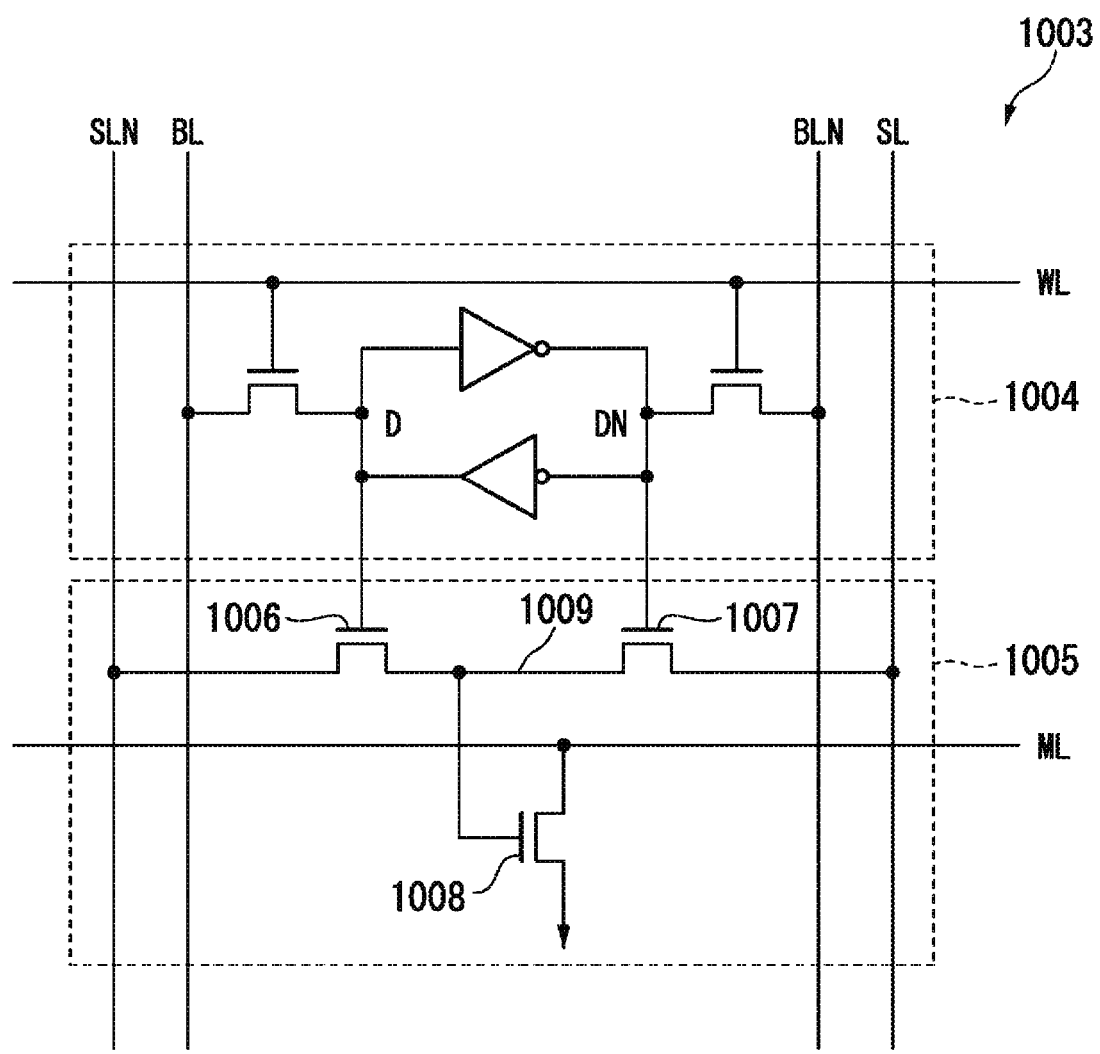
FIG. 12 is a diagram showing an example of a circuitry configuration of the CAM cell.

FIG. 12 is a configuration circuit diagram of the CAM cell of FIG. 11. The CAM cell 1003 shown in FIG. 12 is a mismatch detection type. The CAM cell 1003 may include a memory cell 1004 and a match comparator 1005. The memory cell 1004 is the memory cell of an SRAM configuration for storing 1-bit data. "D" represents data and a "DN" represents inverted data in FIG. 12. The match comparator 1005 may compare the 1-bit data stored in the memory cell 1004 with the search data driven on a search bit line pair SL, and SLN, and may produce the result of the match comparison on a match line ML.

The match comparator 1005 may include three nMOS transistors (hereinafter referred to as "nMOS") 1006, 1007, and 1008. The nMOSs 1006 and 1007 may be connected in series between a search bit line SLN and a search bit line SL. The gates of the nMOSs 1006 and 1007 may be respectively connected to the data D and inverted data DN of the memory cell 1004. The nMOS 1008 may be connected between the match line ML and the ground. The gate of the nMOS 1008 may be connected to the node 1009 between the nMOSs 1006 and 1007.

First, prior to the search, the data (registered vector) which is the searching target is written in each of the words W1 to Wm of the CAM 1000. The writing of the data to the memory cell 1004 and reading of the data from the memory cell 1004 may be performed in the same manner as a normal SRAM in each CAM cell 1003 in each word.

At the time of the searching, the search data is firstly stored in the comparison register 1001. Each bit of the search data is driven by the corresponding search bit line using the search bit line driver 1002.

In each of the words W1 to Wm, a match operation between the data stored in each CAM cell and the search data driven by the search bit line may be executed at the same time (parallel), and the results may be sent to the match lines ML1 to MLm. The results of the search operation are respectively inputs to the match sense circuits MSC1 to MSCm. Each of the match sense circuit MSC1 to MSCm may amplify each of the results of the search operation, and may produce it as a match sense output to match sense output lines MT1 to MTm. Each of the match sense outputs may be stored in match flag registers MFR1 to MFRm, and may be sent to match flag output lines MF1 to MFm as a match flag output. It is assumed that "1" indicates "match" and "0" indicates "mismatch" in the match flag.

Each of the match flag outputs may be an input to the priority encoder PE. The priority encoder PE may select and produce an address of the word (the highest priority match address: HMA) of the highest priority among the words for which the matching were detected according to a predetermined priority. It is assumed that the priority of each word is the highest in the word W1 and decreases in-order toward the word Wm.

Incidentally, the match operation in each CAM CELL 1003 in each word W1 to Wm may be executed in the following manner.

First, an initialization operation may be executed. In the initialization operation, both the search bit line pair SL and SLN are set to "L" (="0"). On the other hand, according to the data stored in the memory cell 1004, one of the nMOSs 1006 and 1007 of the match comparator 1005 may be turned on, and the other may be turned off. Therefore, a level of the node 1009 between the two may be turned to the "L" through the on state nMOS either 1006 or 1007, and the nMOS 1008 may be turned off. In this state, the match line ML may be pre-charged to "H" (="1") state. In the match line ML, the "H" represents "match".

Next, each bit of the search data stored in the comparison register 1001 is applied to each CAM CELL 1003 via the search bit lines. As a result, either one of the search bit line pair SL or SLN may be turned to "H" and the other may be turned to "L" depending on the search data S.

If the data D stored in the memory cell 1004 matches the search data S, the level of the node 1009 may be turned to "L", and the nMOS 1008 may be held in the OFF state.

On the other hand, if the data D and the search data S do not match, the level of the node 1009 may be turned to "H", and the nMOS 1008 may be turned to the ON state. As a result, the match line ML is discharged to the "L" state.

The match line ML of the CAM word comprising the n-bit CAM cell 1003 may configure a wired OR circuit in which the nMOSs 1008 of the respective CAM cells 1003 may be connected in-parallel. Therefore, the match line ML may be held in the state of "H" ("match") only when the match is detected in all the m-bit CAM cells 1003 configuring one word. On the other hand, if a mismatch is detected in the CAM cell 1003 even with the 1-bit, the match line ML may be in the state of "L" ("mismatch").

For example, assumed that "0", "1", "1", "0", . . . , "1", and "0" may be stored as the match flags in the match flag registers MFR1 to MFRm as the result of the search. In this case, the match may be detected in the words W2, W3, . . . , and Wm−1. Therefore, the priority encoder PE may produce the address of the word W2 with the highest priority as the HMA. Also, the address of the word W3 with the next highest priority may be produced as the HMA by clearing the match flag stored in the match flag register MFR2 to "0". The addresses of the words for which the match is detected may be sequentially produced.

Incidentally, when it is used as the TCAM, both the search bit line pair SL and SLN may be set to "L" (="0") for the bits of the "do not care". Thus, the conventional CAM 1000 used as the CAM 110-C provided in the content addressable memory 200 according to the second embodiment has been described.

According to the above-described second embodiment, the CAM 110-C is provided together with the plural index generators 110-1, 110-2, 110-3, . . . , and 110-N. Therefore, since the CAM 110-C can realize arbitrary registered vectors even if it is impossible to avoid the hash collision in the index generators 110-1, 110-2, 110-3, . . . , and 110-N, can be completely eliminated the problem related to the hash collision. Further, since most of the registered vectors may be realized by the plural index generators 110-1, 110-2, 110-3, . . . , and 110-N, the storage capacity of the CAM 110-C may be small. Therefore, the power consumption of the CAM 110-C can be reduced. According to the second embodiment, same as in the first embodiment, it is possible to realize the large storage capacity of the content addressable memory 200 while suppressing the increase of the bit cost and the power consumption. Furthermore, it is possible to completely avoid the hash collision caused by the hash function.

Next, as a reference, the result of an experiment of the update operation by the content addressable memory 200 of the second embodiment will be described. The experiment of the update operation is performed by using a simulator developed in the C language in the case of combining four index generators 110-*i* and one CAM, and in the case of combining five index generators 110-*i* and one CAM. In this experiment, it is assumed that random vectors are updated one million times, and the size of the storage capacity of the CAM (CAM 110-C) required to avoid the hash collision occurred in index generators 110-*i* is computed. In this experiment, it is assumed that N=32, k=100000, and the Mersenne twister method was used as a method of generating random numbers to generate input vectors.

The update procedure in the experiment is as follows.
(Procedure 1)
K registered vectors may be generated and stored in the plural index generators 110-*i* and the CAM of the content addressable memory 100 according to the present invention.
(Procedure 2)
One registered vector may be randomly selected from the plural registered vectors, and the registered vector may be deleted from the content addressable memory 100.
(Procedure 3)
A new registered vector may be generated and stored in the content addressable memory 100.

In the above experiments, the average value and the maximum value of the number of the vectors registered in the CAM were recorded. The values acquired from the result of the simulation by the experiment and the values acquired by the probability analysis almost agreed. The number of the words of the CAM becomes too large in the case of the combination of the three index generators 110-$i$ and one CAM considering the restriction of an FPGA (Field Programmable Gate Array) used for realizing the content addressable memory. Therefore, the combination of the five index generators 110-$i$ and one CAM is desirable. Through the above experiments, it was possible to confirm the effectiveness of the content addressable memory according to the above embodiment.

The embodiments of the present invention have been described above, the present invention is not limited to the above-described embodiments, and various modifications, changes, modifications, substitutions, and the like may be made without departing from the present invention.

DESCRIPTION OF THE REFERENCE SYMBOLS 100, 200 content addressable memory
110-1, 110-2, 110-3, 110-$i$, 110-N index generator
110-C CAM
111 hash circuit
112 provisional index generation circuit
113 regenerated vector generation circuit
114 comparator
115 output circuit
116 collision signal generation circuit
120 output unit
130 controller
1000 CAM
1003 CAM cell

The invention claimed is:

1. A content addressable memory comprising:
plural index generators configured to generate a signature of an input vector using plural hash functions, and to generate an index corresponding to the input vector by searching registered information for a registered vector based on the signature;
an output unit configured to combine each output of the plural index generators to produce the index corresponding to the input vector;
a controller configured to control an update of the registered information; wherein
each of the plural index generators is configured to generate a first signal indicating whether the index generated based on the signature exists as the registered information to supply the first signal to the controller, to generate a regenerated vector of the input vector by using the index generated based on the signature, to generate a second signal indicating whether the regenerated vector matches the input vector, and to supply the second signal to the controller,
wherein each of the plural index generators comprises:
a hash circuit that computes the signature of the input vector from the input vector;
a provisional index generation circuit that has main storage in which the index of the registered vector is stored as the registered information, and reads a provisional index corresponding to the signature from the main storage and produces the provisional index;
a collision signal generation circuit that generates and produces the first signal based on the provisional index produced by the provisional index generation circuit;
a regenerated vector generation circuit that has secondary storage in which the registered vector is stored as the registered information, reads a vector corresponding to the provisional index from the secondary storage and produces the vector as the regenerated vector,
a comparator that compares the regenerated vector with the input vector and produces the second signal indicating whether the regenerated vector matches the input vector, and
an output circuit that produces the provisional index as a specific index corresponding to the input vector if the second signal indicates that the regenerated vector matches the input vector and produces an invalid value if the second signal indicates that the regenerated vector does not match the input vector.

2. The content addressable memory according to claim 1, wherein the main storage and the secondary storage are integrated into one memory.

3. The content addressable memory according to claim 1, wherein the main storage comprises a memory where a bit sequence indicating the signature is inserted as an address signal.

4. The content addressable memory according to claim 1, wherein the secondary storage comprises a memory where a bit sequence indicating the provisional index is inserted as an address signal.

5. The content addressable memory according to claim 1, further comprising:
a CAM having a CAM cell in place of a part of the index generators among the plural index generators or in addition to the plural index generators.

6. A content addressable memory comprising:
plural index generators configured to generate a signature of an input vector using plural hash functions, and to generate an index corresponding to the input vector by searching registered information for a registered vector based on the signature;
an output unit configured to combine each output of the plural index generators to produce the index corresponding to the input vector;
a controller configured to control an update of the registered information; wherein
each of the plural index generators is configured to generate a first signal indicating whether the index generated based on the signature exists as the registered information to supply the first signal to the controller, to generate a regenerated vector of the input vector by using the index generated based on the signature, to generate a second signal indicating whether the regenerated vector matches the input vector, and to supply the second signal to the controller,
wherein the controller is configured to select the index generator configured to supply the first signal indicating that the registered vector to be added does not exist as the registered information and to add the index corresponding to the registered vector to be added as the registered information of the selected index generator, when the registered vector and the index of the registered vector are added as the registered information.

7. The content addressable memory according to claim 1, wherein
when the index of the registered vector registered as the registered information is deleted, the controller is configured to select the index generator supplying the second signal indicating that the registered vector generated by using the index of the registered vector to be deleted among the plural index generators matches the input vector and to delete the index corresponding to the registered vector from the registered information of the selected index generators.

8. An information update method for updating the registered information of the content addressable memory according to claim 1, wherein
the content addressable memory provides a search mode and an update mode as an operation mode, and
the controller provided in the content addressable memory controls for updating the registered information in the update mode,
wherein the controller is configured to delete the index corresponding to the registered vector registered as the registered information and thereby updating the registered information by adding the index corresponding to the registered vector to be added as the registered information.

9. The information update method according to claim 8, wherein the plural index generators and the output unit work as the CAM in the search mode.

10. The information update method according to claim 8, further comprising:
in the update mode,
a first step of supplying the registered vector to be deleted as the input vector to plural index generators provided in the content addressable memory;
a second step of determining for each of the plural index generators whether the specific index corresponding to the registered vector to be deleted exists as the registered information based on the second signal by the control unit;
a third step of changing a value of the index corresponding to the registered vector to be deleted which exists as the registered information from the valid value to the invalid value by the controller when the specific index corresponding to the registered vector to be deleted exists as the registered information in any one of the plural index generators.

11. The information update method according to claim 8, comprising:
in the update mode,
the first step of supplying the registered vector to be added as the input vector to the plural index generators;
the second step of determining whether or not the provisional index corresponding to the registered vector to be added exists as the registered information based on the first signal by the controller for each plural index generator;
the third step of setting the valid value as the value of the index corresponding to the registered vector to be added when the provisional index corresponding to the registered vector to be added does not exist as the registered information in any of the plural index generators.

12. The information update method according to claim 11, wherein
the controller is configured to set the valid value as the value of the index corresponding to the registered vector to be added to the other index generator that does not have the provisional index corresponding to the registered vector to be added when the provisional index corresponding to the registered vector to be added exists as the registered information in any one of the plural index generators.

* * * * *